(12) United States Patent
Park et al.

(10) Patent No.: US 12,135,485 B2
(45) Date of Patent: Nov. 5, 2024

(54) DISPLAY DEVICE

(71) Applicant: Samsung Display Co., LTD., Yongin-si (KR)

(72) Inventors: Do Yeong Park, Hwaseong-si (KR); Seul Bee Lee, Suwon-si (KR); Soo Hong Cheon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/144,228

(22) Filed: May 7, 2023

(65) Prior Publication Data

US 2023/0273488 A1    Aug. 31, 2023

Related U.S. Application Data

(63) Continuation of application No. 17/008,656, filed on Sep. 1, 2020, now Pat. No. 11,681,189.

(30) Foreign Application Priority Data

Feb. 19, 2020   (KR) ........................ 10-2020-0020431

(51) Int. Cl.
*G02F 1/1362* (2006.01)
*G02F 1/1333* (2006.01)
*G02F 1/1368* (2006.01)

(52) U.S. Cl.
CPC .. *G02F 1/136286* (2013.01); *G02F 1/133345* (2013.01); *G02F 1/136227* (2013.01);
(Continued)

(58) Field of Classification Search
CPC .................................................. G02F 1/13628
See application file for complete search history.

(56) References Cited

U.S. PATENT DOCUMENTS 9,620,533 B2   4/2017   Kim et al.
9,891,485 B2   2/2018   Jung
(Continued)

FOREIGN PATENT DOCUMENTS

KR   10-2016-0084385   7/2016
KR   10-2016-0084553   7/2016
(Continued)

OTHER PUBLICATIONS

European Search Report mailed Jun. 18, 2021, in EP Application No. 20217132.8.
(Continued)

*Primary Examiner* — Sang V Nguyen
(74) *Attorney, Agent, or Firm* — CANTOR COLBURN LLP

(57) ABSTRACT

A display device including a gate line, a data line, a first thin film transistor including a first source electrode extending from the data line, and a first drain electrode spaced apart from the first source electrode, a second thin film transistor including a second source electrode extending from the first source electrode, and a second drain electrode spaced apart from the second source electrode, a third thin film transistor including a third drain electrode extending from the second drain electrode, and a third source electrode spaced apart from the third drain electrode, a first sub-pixel electrode electrically connected to the first drain electrode through a first contact hole, a first reference voltage line electrically connected to the third source electrode through a second contact hole, and a second sub-pixel electrode electrically connected to the second drain electrode through a third contact hole.

14 Claims, 19 Drawing Sheets

(52) U.S. Cl.
CPC ........ *G02F 1/13624* (2013.01); *G02F 1/1368* (2013.01); *G02F 1/136222* (2021.01); *G02F 2201/40* (2013.01)

(56) References Cited

U.S. PATENT DOCUMENTS

| | | | |
|---|---|---|---|
| 9,967,511 B2 | 5/2018 | Ritter et al. | |
| 10,481,450 B2 | 11/2019 | Woo | |
| 2015/0109554 A1* | 4/2015 | Lee | G02F 1/1362 349/48 |
| 2016/0202580 A1 | 7/2016 | Hong et al. | |
| 2017/0059947 A1* | 3/2017 | Kim | G02F 1/133707 |
| 2017/0160583 A1* | 6/2017 | Baek | G02F 1/1368 |
| 2017/0184932 A1 | 6/2017 | Park et al. | |
| 2018/0039110 A1 | 2/2018 | Huh et al. | |
| 2018/0129110 A1 | 5/2018 | Syn et al. | |
| 2019/0018268 A1* | 1/2019 | Lee | H01L 27/124 |
| 2020/0004069 A1* | 1/2020 | Kim | G02F 1/1368 |
| 2020/0089068 A1 | 3/2020 | Kim et al. | |
| 2020/0142228 A1* | 5/2020 | Hong | H01L 27/1288 |
| 2020/0363689 A1 | 11/2020 | Jeon et al. | |
| 2020/0403053 A1* | 12/2020 | Kim | H01L 27/124 |

FOREIGN PATENT DOCUMENTS

| | | |
|---|---|---|
| KR | 10-2017-0007578 | 1/2017 |
| KR | 10-2018-0036852 | 4/2018 |
| KR | 10-2020-0032805 | 3/2020 |

OTHER PUBLICATIONS

Non-Final Office Action issued Mar. 31, 2022, in U.S. Appl. No. 17/008,656.
Non-Final Office Action issued Jul. 14, 2022, in U.S. Appl. No. 17/008,656.
Non-Final Office Action issued Oct. 11, 2022, in U.S. Appl. No. 17/008,656.
Notice of Allowance issued Feb. 7, 2023, in U.S. Appl. No. 17/008,656.

* cited by examiner

DISPLAY DEVICE

CROSS-REFERENCE TO RELATED APPLICATION

This application is a Continuation of U.S. patent application Ser. No. 17/008,656, filed Sep. 1, 2020, which claims priority from and the benefit of Korean Patent Application No. 10-2020-0020431, filed on Feb. 19, 2020, each of which is hereby incorporated by reference for all purposes set forth herein.

BACKGROUND

Field

Exemplary embodiments of the invention relate generally to a display device.

Discussion of the Background

The importance of a display device has increased with the development of multimedia. Accordingly, various types of display devices, such as a liquid crystal display (LCD) and an organic light emitting display (OLED), are being used.

Among display devices, a liquid crystal display device, which is one of the most widely used flat panel display devices, includes two substrates on which field generating electrodes, such as a pixel electrode and a common electrode are formed, and a liquid crystal layer interposed therebetween. In the liquid crystal display device, a voltage is applied to the field generation electrodes to generate an electric field in the liquid crystal layer, and thus, the alignment direction of liquid crystal molecules in the liquid crystal layer are determined and polarization of incident light is controlled, thereby displaying an image.

The liquid crystal display device may be driven by an active matrix method using a thin film transistor. In the active matrix method, a thin film transistor is typically connected to a pixel electrode, and the display device may be driven according to a voltage maintained by a capacitor capacity of the thin film transistor. In such a liquid crystal display, a plurality of holes may be formed to connect a wiring and an electrode or between electrodes. However, forming the plurality of holes may reduce an aperture ratio of the display.

The above information disclosed in this Background section is only for understanding of the background of the inventive concepts, and, therefore, it may contain information that does not constitute prior art.

SUMMARY

Display devices constructed according to exemplary embodiments of the invention are capable of improving an aperture ratio.

A display device according to exemplary embodiments is also capable of improving the adhesivity of an insulating layer.

Additional features of the inventive concepts will be set forth in the description which follows, and in part will be apparent from the description, or may be learned by practice of the inventive concepts.

A display device according to an exemplary embodiment includes a gate line and a storage line arranged on a substrate in a first direction and spaced apart from each other, a data line and a partial voltage reference line arranged in a second direction crossing the first direction and spaced apart from each other, a first thin film transistor including a first source electrode extending from the data line, and a first drain electrode spaced apart from the first source electrode, a second thin film transistor including a second source electrode extending from the first source electrode, and a second drain electrode spaced apart from the second source electrode, a third thin film transistor including a third drain electrode extending from the second drain electrode, and a third source electrode spaced apart from the third drain electrode and extending from the partial voltage reference line, a color filter disposed on the first, second, and third thin film transistors and including a first via hole exposing the third source electrode and the third drain electrode, and an insulating layer disposed on the color filter and including a first contact hole exposing the storage line and a second contact hole exposing the third drain electrode, in which the first contact hole and the second contact hole are disposed in the first via hole when viewed in plan.

The first contact hole and the second contact hole may be spaced apart from each other with the gate line therebetween when viewed in plan.

The display device may further include a semiconductor layer overlapping the first, second, third source electrodes, the first, second, and third drain electrodes, and the gate line.

The color filter may further include a second via hole exposing the first drain electrode, and the insulating layer may further include a third contact hole overlapping the second via hole and exposing the first drain electrode.

The first via hole may overlap the gate line, and the first contact hole and the second contact hole may not overlap the gate line.

The first via hole may intersect the gate line.

Each of the first contact hole, the second contact hole, and the first via hole may have a width in a second direction crossing the first direction, and a sum of the widths of the first contact hole and the second contact hole may be less than the width of the first via hole.

The display device may further include a first electrode pattern disposed on the insulating layer and contacting the third source electrode and the storage line through the first contact hole and the first via hole, and a second electrode pattern disposed on the insulating layer and contacting the third source electrode through the second contact hole and the first via hole.

The first electrode pattern may include a bridge pattern connecting the third source electrode and the storage line.

The display device may further include a first sub-pixel electrode disposed on the insulating layer and connected to the first drain electrode, and a second sub-pixel electrode disposed adjacent to the first sub-pixel electrode with the gate line therebetween, in which the second electrode pattern may include the second sub-pixel electrode.

The display device may further include a first conductive pattern disposed between the storage line and the insulating layer, and overlapping the first electrode pattern, and a second conductive pattern disposed between the storage line and the insulating layer, and overlapping the second electrode pattern, in which the first conductive pattern and the second conductive pattern may be spaced apart from each other with the gate line therebetween in a second direction crossing the first direction.

The first conductive pattern may overlap the storage line, the first contact hole, and the insulating layer.

The first conductive pattern and the second conductive pattern may be disposed directly on the same layer as the third source electrode or the third drain electrode, and may include the same material.

The first conductive pattern may be formed as an island pattern spaced apart from the third source electrode.

The second conductive pattern may overlap the second contact hole and the insulating layer.

The second conductive pattern may be integrally formed with the third drain electrode.

The first conductive pattern and the third source electrode may continuously extend from the partial voltage reference line.

The first conductive pattern may be spaced apart from the partial voltage reference line.

A display device according to another exemplary embodiment includes a gate line disposed on a substrate in a first direction, a data line disposed in a second direction crossing the first direction, a first thin film transistor including a first source electrode extending from the data line, and a first drain electrode spaced apart from the first source electrode, a second thin film transistor including a second source electrode extending from the first source electrode, and a second drain electrode spaced apart from the second source electrode, a third thin film transistor including a third drain electrode extending from the second drain electrode, and a third source electrode spaced apart from the third drain electrode, and a first conductive pattern extending from the third source electrode and disposed in parallel to the third source electrode.

The first conductive pattern may include a first vertical portion extending from one end of the third source electrode in a direction crossing the third source electrode, and a first horizontal portion extending from one end of the first vertical portion in parallel to the third source electrode.

The first conductive pattern may be spaced apart from the third source electrode.

The display device may further include a second conductive pattern extending from the third drain electrode in a direction adjacent to the first conductive pattern.

The first conductive pattern and the second conductive pattern may be spaced apart from each other with the gate line therebetween It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
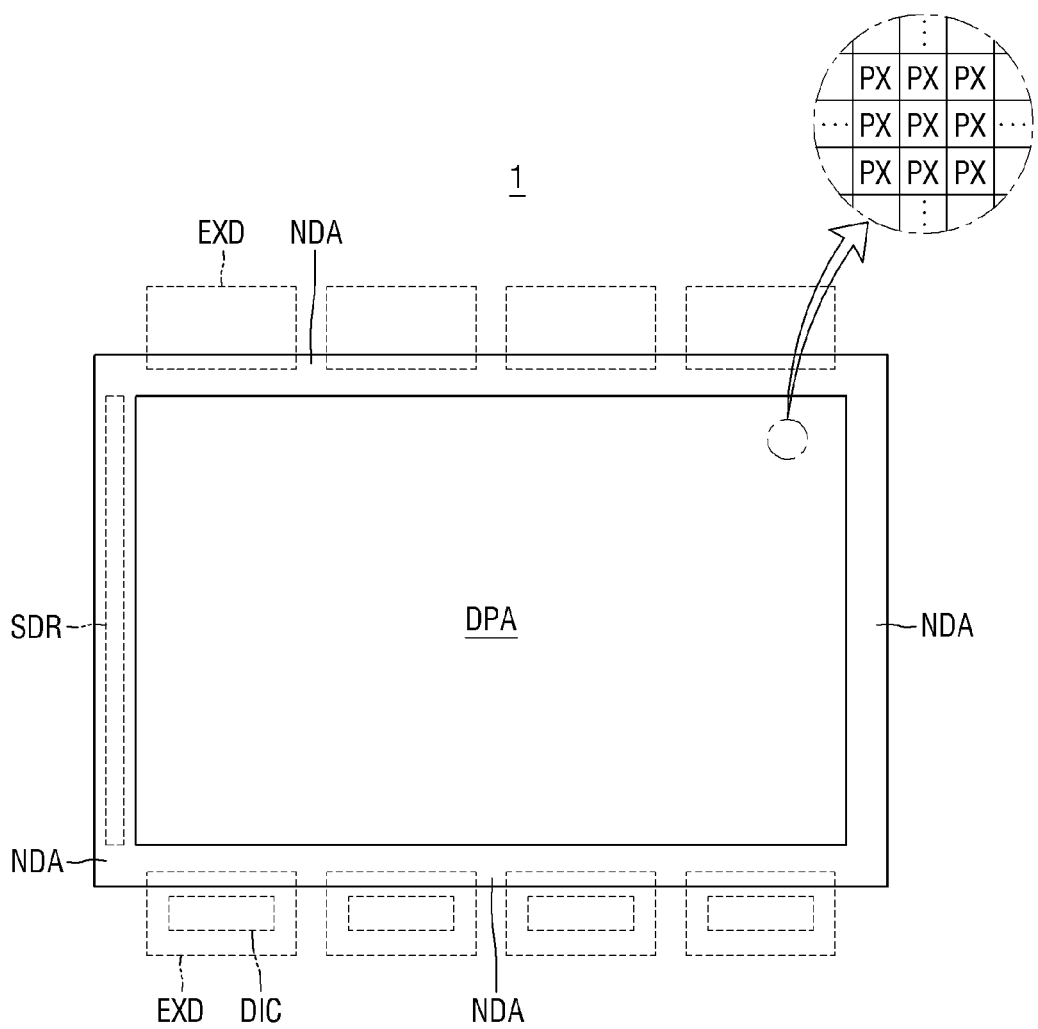
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described with reference to the attached drawings.

FIG. 1 is a plan view of a display device according to an exemplary embodiment.

Referring to FIG. 1, a display device 1 may be applied to smart phones, portable phones, tablet personal computers (PCs), personal digital assistants (PDAs), portable multimedia players (PMPs), televisions, game machines, and wristwatch-type electronic appliances, head mount displays, monitors of personal computers, notebook computers, car navigators, car dashboards, digital cameras, camcorders, outdoor billboards, medical devices, inspection devices, various household appliances, such as refrigerators and washing machines, or internet of things (IoTs). Hereinafter, a display device will exemplarily be described as being applied to a television (TV), and the TV may have high resolution to ultrahigh resolution, such as HD, UHD, 4K, and 8K.

The display device 1 according to exemplary embodiments may be variously classified according to a display method. For example, display devices may be classified into a liquid crystal display (LCD), an organic light emitting display (OLED), an inorganic light emitting display (inorganic EL), a quantum dot light emitting display (QED), and a micro LED display (micro-LED), a nano LED display (nano-LED), a plasma display (PDP), a field emission display (FED), a cathode ray display (CRT), and an electrophoretic display (EPD). Hereinafter, a display device will exemplarily be described with reference to a liquid crystal display device, and thus, the liquid crystal display device will simply be referenced as a display device, unless stated otherwise. However, the inventive concepts are not limited to a liquid crystal display device, and other display devices listed above or known in the art may be applied in other exemplary embodiments.

The display device 1 according to an exemplary embodiment may have substantially a square shape, for example, substantially a rectangular shape, in a plan view. When the display device 1 is a television, long sides are located in the horizontal direction. However, the inventive concepts are not limited thereto, and in some exemplary embodiments, the long sides may be located in the vertical direction, and the long sides may also be variably located in the horizontal or vertical direction by being rotatable.

The display device 1 may include a display area DPA and a non-display area NDA. The display area DPA may be an active area in which an image is displayed. The display area DPA may have substantially a rectangular shape in a plan view, similarly to the overall shape of the display device 1, but the inventive concepts are not limited to a particular shape of the display area DPA.

The display area DPA may include a plurality of pixels PX. The plurality of pixels PX may be arranged in a matrix direction. The shape of each pixel PX may be substantially rectangular or square in a plan view, but is not limited thereto, and may have substantially a rhombus shape, in which each side is inclined with respect to a direction of one side of the display device 1. The plurality of pixels PX may include several color pixels PX. For example, the plurality of pixels PX may include, but is not limited to, a first color pixel PX of a red color, a second color pixel PX of a green color, and a third color pixel PX of a blue color. The color pixels PX may be alternately arranged in a stripe type or a pentile type.

The non-display area NDA may be disposed around the display area DPA. The non-display area NDA may entirely or partially surround the display area DPA. The display area DPA has substantially a rectangular shape, and the non-display area NDA may be disposed adjacent to four sides of the display area DPA. The non-display area NDA may form at least a portion of a bezel of the display device 1.

A driving circuit or a driving element for driving the display area DPA may be disposed in the non-display area NDA. In an exemplary embodiment, in the first non-display area NDA adjacent to the first long side (lower side in FIG. 1) of the display device 1 and the second non-display NDA adjacent to the second long side (upper side in FIG. 1) of the display device 1, a pad unit may be provided on a display substrate of the display device 1, and an external device EXD may be mounted on a pad electrode of the pad unit. For example, the external device EXD may include a connection film, a printed circuit board, a driving chip (DIC), a connector, and a wiring connection film, etc. In the third non-display area NDA disposed adjacent to the first short side (left side in FIG. 1) of the display device 1, a scan driver (SDR) or the like directly formed on the display substrate of the display device 1 may be formed.

Figure 2:
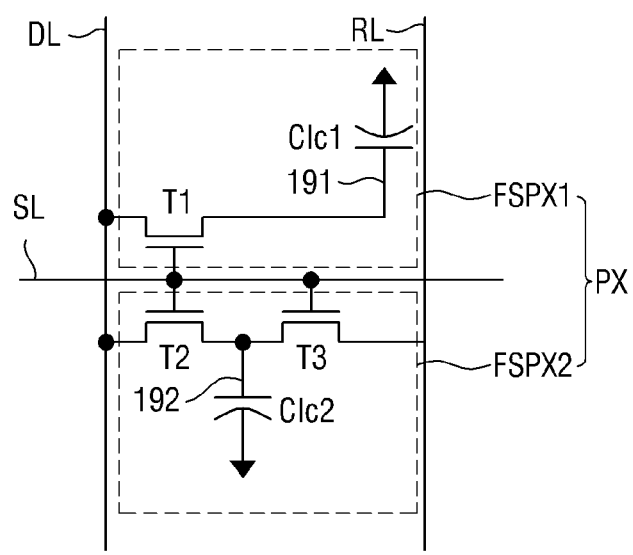
FIG. 2 is an exemplary circuit diagram of one pixel of the display device of FIG. 1.

FIG. 2 is an exemplary circuit diagram of one pixel of the display device of FIG. 1.

Referring to FIG. 2, a gate line SL, a data line DL intersecting the gate line SL, and a partial voltage reference line RL intersecting the gate line SL are disposed. The gate line SL may transmit scan signals to a first switching element T1, a second switching element T2, and a third switching element T3, respectively. The data line DL may transmit a data voltage to the pixel through the first switching element T1 and the second switching element T2. A constant reference voltage (or a partial voltage reference voltage) may be applied to the partial voltage reference line RL.

The color pixel SPX may include a first sub-pixel area FSPX1 and a second sub-pixel area FSPX2. The first sub-pixel area FSPX1 may include a first switching element T1 and a first liquid crystal capacitor Clc1, and the second sub-pixel area FSPX2 may include a second switching element T2, a second liquid crystal capacitor Clc2, and a third switching element T3. Each of the first switching element T1, the second switching element T2, and the third switching element T3 may be a thin film transistor.

The first switching element T1 may include a first electrode connected to the data line DL, a second electrode connected to the first liquid crystal capacitor Clc1, and a gate electrode connected to the gate line SL. The second electrode of the first switching element T1 may be connected to a first sub-pixel electrode 191 constituting the first liquid crystal capacitor Clc1.

The second switching element T2 may include a first electrode connected to the data line DL, a second electrode connected to the second liquid crystal capacitor Clc2, and a gate electrode connected to the gate line SL. The second electrode of the second switching element T2 may be connected to a second sub-pixel electrode 192 constituting the second liquid crystal capacitor Clc2.

The third switching element T3 may include a second electrode connected to the second liquid crystal capacitor Clc2, a first electrode connected to the partial voltage reference line RL, and a gate electrode connected to the gate line SL. A reference voltage for partial voltage may be applied to the second electrode of the third switching element T3 through the partial voltage reference line RL.

The first electrode of each of the first switching element T1, the second switching element T2, and the third switching element T3 may be a source electrode, and the second electrode thereof may be a drain electrode.

The first liquid crystal capacitor Clc1 and the second liquid crystal capacitor Clc2 are connected to a common electrode, and a common voltage may be applied to the common electrode.

When a gate-on voltage is applied to the gate line SL, each of the first switching element T1, the second switching element T2, and the third switching element T3 may be turned on, and the first liquid crystal capacitor Clc1 and the second liquid crystal capacitor Clc2 may be charged by a data voltage transmitted through the data line DL. In this case, the data voltages applied to the first sub-pixel electrode 191 and the second sub-pixel electrode 192 may be the same as each other. The first liquid crystal capacitor Clc1 may be charged in response to a difference between the common voltage and the data voltage, and the second liquid crystal capacitor Clc2 may be charged in response to a difference between the data voltage divided by the third switching element T3 and the common voltage.

Since the third switching element T3 is connected in series to the second switching element T2, and the third switching element T3 is turned on, the data voltage transmitted to the second sub-pixel area FSPX2 may be divided by the second switching element T2 and the third switching element T3. The data voltage may be divided based on the size (or capacity) of a channel of the second switching element T2 and the size of a channel of the third switching element T3. In this manner, even when the data voltages transmitted to the first sub-pixel area FSPX1 and the second sub-pixel area FSPX2 through the data line DL are the same as each other, the voltages charged in the first liquid crystal capacitor Clc1 and the second liquid crystal capacitor Clc2 may be different from each other. For example, the voltage charged in the second liquid crystal capacitor Clc2 may be lower than the voltage charged in the first liquid crystal capacitor Clc1. In this case, side visibility of the display device 1 may be improved.

The voltage level of the reference voltage applied to the second electrode of the third switching element T3 may be equal to or higher than the voltage level of the common voltage applied to the common electrode. For example, when the common voltage is about 7V, the reference voltage applied to the second electrode of the third switching element T3 may be about 7V to 11V, without being limited thereto.

Figure 3:
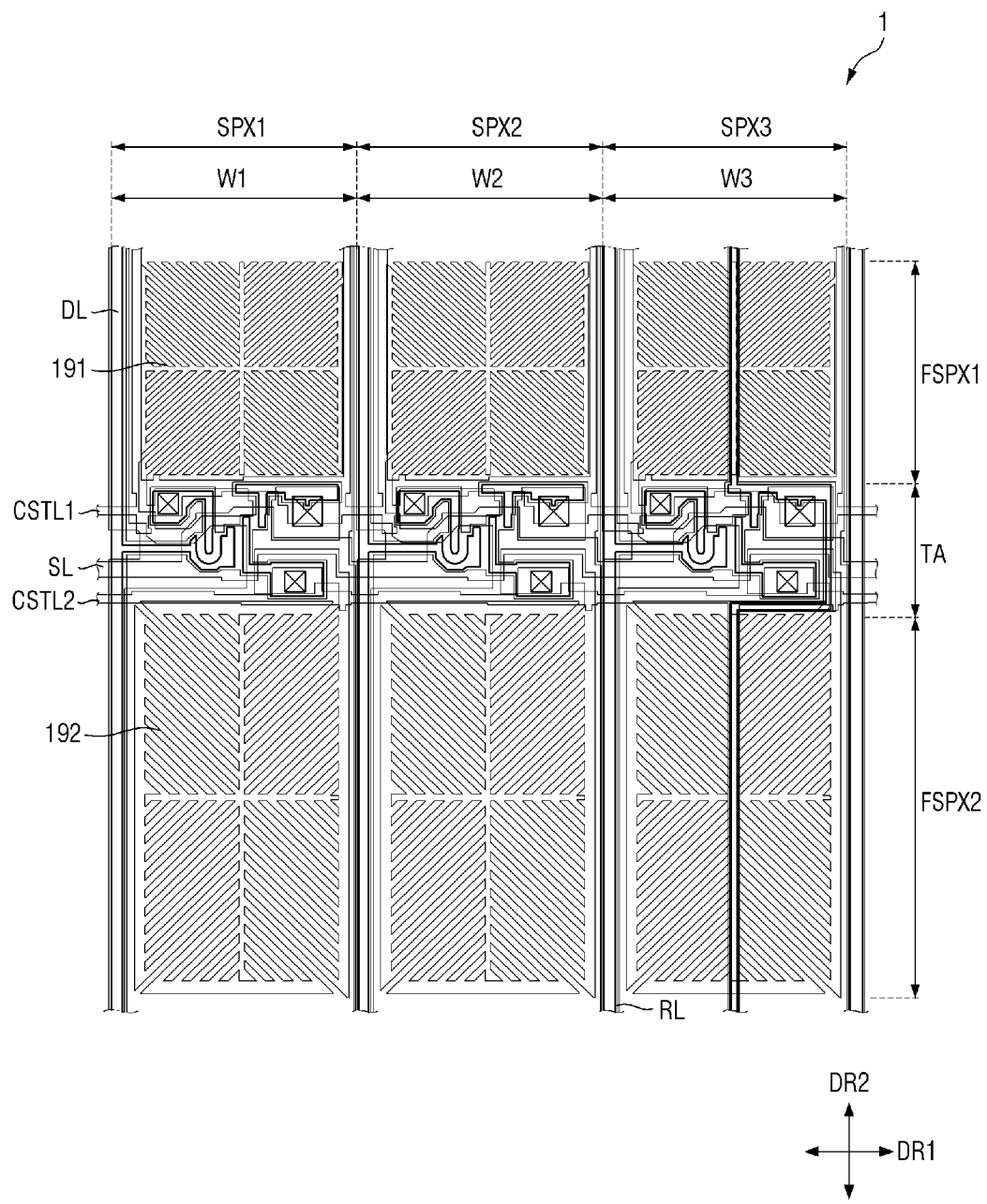
FIG. 3 is a plan view illustrating the pixels of a display device according to an exemplary embodiment.

FIG. 3 is a plan view illustrating the pixels of a display device according to an exemplary embodiment.

Referring to FIG. 3, each pixel PX may include a plurality of color pixels SPX1, SPX2, and SPX3. In an exemplary embodiment, the first color pixel SPX1 may be a red pixel, the second color pixel SPX2 may be a green pixel, and the third color pixel SPX3 may be a blue pixel. Data lines DL, gate lines SL, and storage lines CSTL1 and CSTL2 may pass through the color pixels SPX1, SPX2, and SPX3, respectively. The data line DL may extend along the second direction DR2 and the gate line SL may extend along the first direction DR1.

The first storage line CSTL1 may include a main storage line portion extending along the first direction DR1 and a sub-storage line portion connected to the main storage line portion and extending along the second direction DR2. In some exemplary embodiments, two sub-storage line portions may be provided. For example, one of the sub-storage line portions may be disposed between a data line DL connected to each of the color pixels SPX1, SPX2, and SPX3 and first and second sub-pixel electrodes of each of the color pixels SPX1, SPX2, and SPX3 to be described later, and the other one of the sub-storage line portions may be disposed between the first or second sub-pixel electrode of each of the color pixels SPX1, SPX2, and SPX3 and the data line DL connected to the adjacent color pixels SPX1, SPX2, and SPX3. The second storage line CSTL2 may extend along the first direction DR1. The extending direction of the second storage line CSTL2 may be the same as the extending direction of the gate line SL.

Different data lines DL may pass through each of the color pixels SPX1, SPX2, and SPX3 of one pixel PX. The data lines DL passing through each of the color pixels SPX1, SPX2, and SPX3 may extend in the first direction DR1 adjacently to each of the color pixels SPX1, SPX2, SPX3, respectively.

The same gate line SL and the first storage line CSTL1 may pass in common through each of the color pixels SPX1, SPX2, and SPX3 of one pixel PX. More particularly, the same gate line SL and the first storage line CSTL1 may be connected to each of the color pixels SPX1, SPX2, and SPX3 of one pixel PX. Further, the second storage line may pass through each of the color pixels SPX1, SPX2, and SPX3.

Each of the color pixels SPX1, SPX2, and SPX3 may be defined as an area between a data line DL connected to each of the color pixels SPX1, SPX2, and SPX3 and a data line DL connected to the adjacent color pixels SPX1, SPX2, and SPX3, based on the first direction DR1. Further, each of the color pixels SPX1, SPX2, and SPX3 may be defined as an area up to the first and second sub-pixel electrodes 191 and 192 respectively disposed on the upper side and lower side of the gate line SL of each of the color pixels SPX1, SPX2, and SPX3, based on the second direction DR2.

Each of the color pixels SPX1, SPX2, and SPX3 may be divided into a plurality of areas. Sub-pixel areas FSPX1 and FSPX2 and a switching element area TA may be defined in each of the color pixels SPX1, SPX2, and SPX3. The first sub-pixel area FSPX1 may be defined as an area in which the first sub-pixel electrode 191 is disposed in the second direction DR2, and the second sub-pixel area FSPX2 may be defined as an area in which the second sub-pixel electrode 192 is disposed in the second direction DR2. The first sub-pixel area FSPX1, the switching element area TA, and the second sub-pixel area FSPX2 may be sequentially disposed along the second direction DR2. In an exemplary embodiment, the planar size of the second sub-pixel area FSPX2 may be larger than the planar size of the first sub-pixel area FSPX1. For example, when the width of the first sub-pixel area FSPX1 in the first direction DR1 is equal to the width of the second sub-pixel area FSPX2 in the first direction DR1 as shown in FIG. 3, the width of the second sub-pixel area FSPX2 in the second direction DR2 may be greater than the width of the first sub-pixel area FSPX1 in the second direction DR2.

The first sub-pixel electrode 191 may be disposed in the first sub-pixel area FSPX1 of each of the color pixels SPX1, SPX2, and SPX3, and the second sub-pixel electrode 192 may be disposed in the second sub-pixel area FSPX2 of each of the color pixels SPX1, SPX2, and SPX3. The first storage line CSTL1 may be disposed between the first sub-pixel electrode 191 and the second sub-pixel electrode 192, and the gate line SL may be disposed between the first storage line CSTL1 and the second sub-pixel electrode 192. The second storage line CSTL2 may be disposed between the second sub-pixel electrode 192 and the gate line SL. The main storage line portion of the first storage line CSTL1 may be disposed between the first sub-pixel electrode 191 of each of the color pixels SPX1, SPX2, and SPX3 and the second sub-pixel electrode 192 of the corresponding second sub-pixel area FSPX2 adjacent to each other in the second direction DR2. The sub-storage line portions of the first storage line CSTL1 of each of the color pixels SPX1, SPX2, and SPX3 may be disposed between the data line DL of each of the color pixels SPX1, SPX2, and SPX3 and the corresponding first sub-pixel electrode 191 of the first sub-pixel area FSPX1, and between the first sub-pixel electrode 191 of the first sub-pixel area FSPX1 of each of the color pixels SPX1, SPX2, and SPX3 and the corresponding data line DL adjacent to each other in the first direction DR1.

A partial voltage reference line RL extending along the second direction DR2 may pass through the third color pixel SPX3. Since the partial voltage reference line RL is electrically connected to the first storage line CSTL1 to be described below, the voltage applied through the partial voltage reference line RL is transmitted to the first storage line CSTL1. In this case, since the first storage line CSTL1 is commonly connected to each of the color pixels SPX1, SPX2, and SPX3 of the pixel PX, the same storage voltage may be applied to each of the color pixels SPX1, SPX2, and SPX3 of the pixel PX.

The planar size of the third color pixel SPX3 may be larger than the planar size of each of the first color pixel SPX1 and the second color pixel SPX2. For example, the width W3 of the third color pixel SPX3 in the first direction DR1 may be greater than each of the width W1 of the first color pixel SPX1 in the first direction DR1 and the width W2 of the second color pixel SPX2 in the first direction DR1. In this manner, light loss in the first sub-pixel area FSPX1 and the second sub-pixel area FSPX2 of the third color pixel SPX3 due to the partial voltage reference line RL passing through the third color pixel SPX3 may be compensated.

Figure 4:
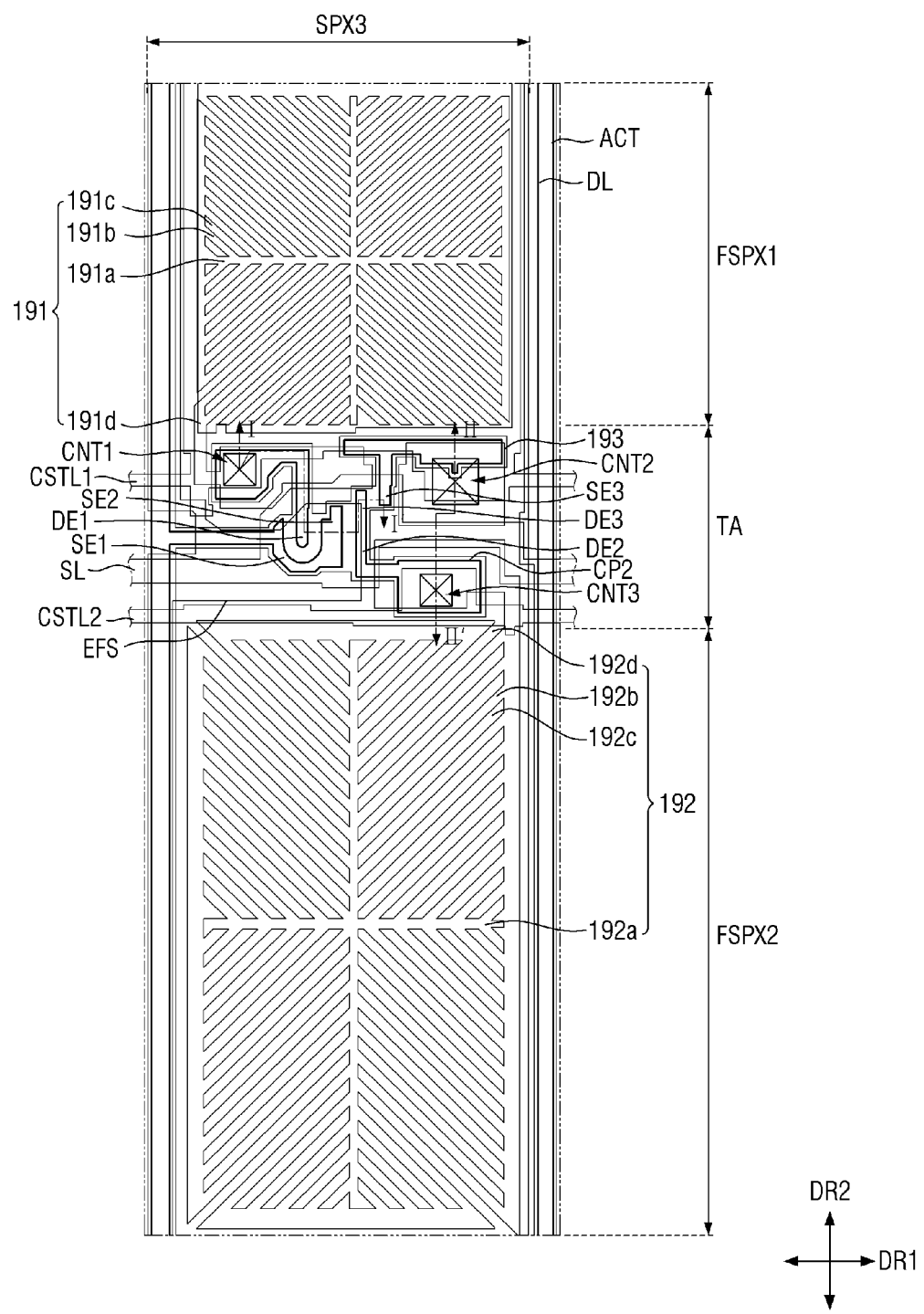
FIG. 4 is an enlarged plan view of a first color pixel of the pixels of FIG. 3.
Figure 5:
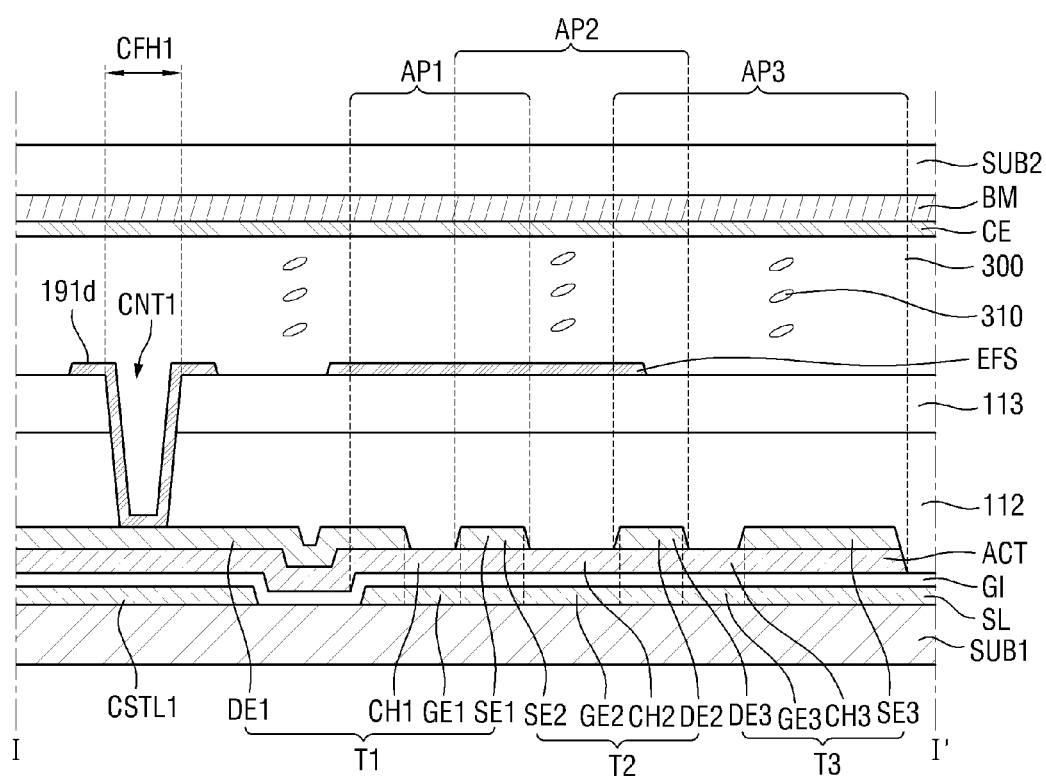
FIG. 5 is a cross-sectional view taken along line I-I' of FIG. 4.
Figure 6:
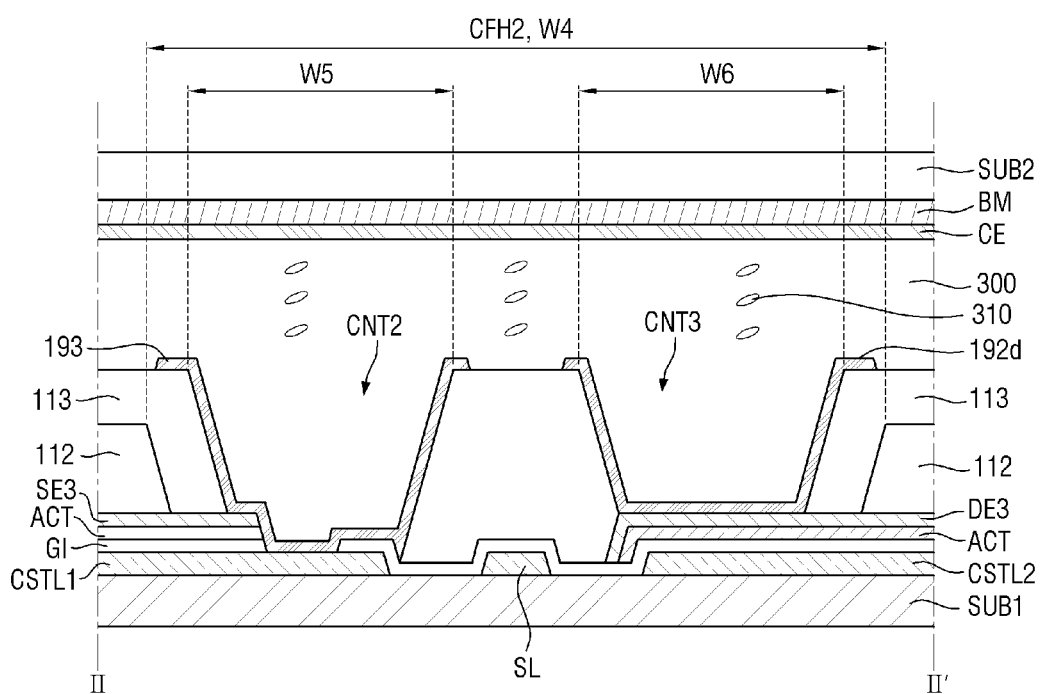
FIG. 6 is a cross-sectional view taken along line II-IT of FIG. 4.
Figure 7:
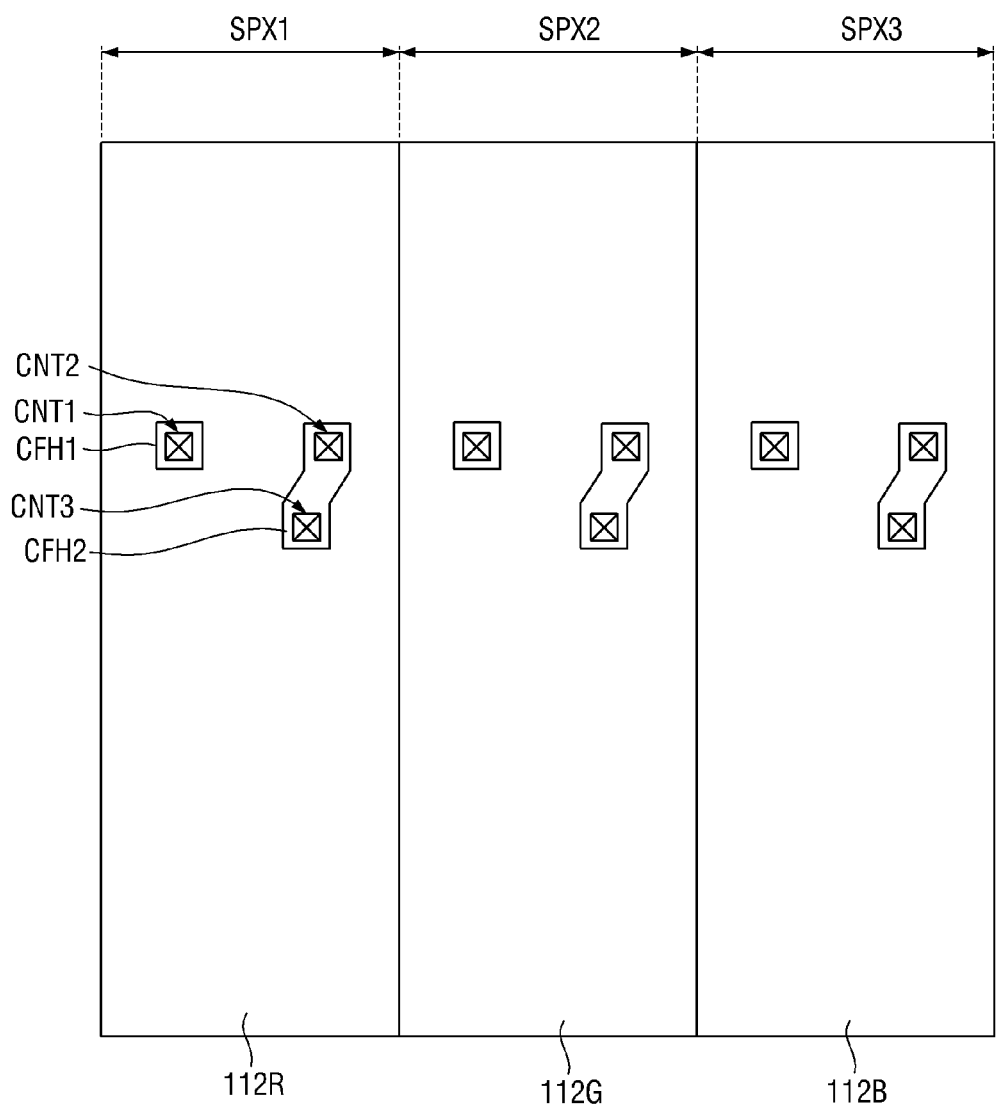
FIG. 7 is a plan view illustrating color filters of first to third color pixels according to an exemplary embodiment.

FIG. 4 is an enlarged plan view of a first color pixel of FIG. 3, FIG. 5 is a cross-sectional view taken along line I-I' of FIG. 4, FIG. 6 is a cross-sectional view taken along line II-If of FIG. 4, and FIG. 7 is a plan view illustrating color filters of first to third color pixels according to an exemplary embodiment.

Referring to FIG. 4, in an exemplary embodiment, since the structures of the first color pixel SPX1 and the second color pixel SPX2 are substantially the same as each other, the structure of the color pixel will be described with reference to the first color pixel SPX1.

The first color pixel SPX1 may include a first switching element T1, a second switching element T2, and a third switching element T3.

The first source electrode SE1 of the first switching element T1 may be connected to the data line DL, and the first drain electrode DE1 of the first switching element T1 may be connected to the first sub-pixel electrode 191 through the first contact hole CNT1. The gate electrode of the first switching element T1 may be a gate line SL.

The first source electrode SE1 of the first switching element T1 may protrude from the data line DL and extend in the first direction DR1. The first source electrode SE1 of the first switching element T1 may be directly connected to the data line DL. The first source electrode SE1 of the first switching element T1 may be integrally formed with the data line DL. The first source electrode SE1 of the first switching element T1 may have a curved shape, such as substantially a "U" shape. The first drain electrode DE1 of the first switching element T1 may be spaced apart from the first source electrode SE1 of the first switching element T1 in the second direction DR2. The planar shape of the first drain electrode DE1 of the first switching element T1 is substantially rectangular, and the first drain electrode DE1 of the first switching element T1 may have a shape in which a portion of the first drain electrode DE1 protrudes and extends downward in the second direction DR2 (in a direction toward one electrode SE1 of the first switching element T1). The portion protruding and extending downward in the second direction DR2 of the first drain electrode DE1 of the first switching element T1 may be surrounded by the first source electrode SE1 of the first switching element T1 in a plan view.

The second source electrode SE2 of the second switching element T2 may be connected to the data line DL. The second source electrode SE2 may be integrally formed with the first source electrode SE1. The second drain electrode DE2 of the second switching element T1 may be connected to the second sub-pixel electrode 192 through the third contact hole CNT3. The gate electrode of the second switching element T2 may be a gate line SL.

The second source electrode SE2 of the second switching element T2 may protrude from the data line DL and extend in the first direction DR1. The second source electrode SE2 may be directly connected to the data line DL. The second source electrode SE2 may be integrally formed with the data line DL. The second drain electrode DE2 may be spaced apart from the second source electrode SE2 in the second direction DR2. The planar shape of the second drain electrode DE2 is substantially rectangular, and the second drain electrode DE2 may have a shape in which a portion of the second drain electrode DE2 protrudes upward in the second direction DR2. The portion of the second drain electrode DE2 protruding upward in the second direction DR2 may be disposed in parallel with the second source electrode SE2.

The third source electrode SE3 of the third switching element T3 may be connected to the partial voltage reference line RL through the second contact hole CNT2. The third drain electrode DE3 of the third switching element T3 may be connected to the second sub-pixel electrode 192 through the second contact hole CNT2, and may be integrally formed with the second drain electrode DE2. The gate electrode of the third switching element T3 may be a gate line SL.

The third drain electrode DE3 may be spaced apart from the third source electrode SE3 in the first direction DR1. The planar shape of the third drain electrode DE3 is substantially rectangular, and the third drain electrode DE3 may have a shape in which a portion of the third drain electrode DE3 protrudes downward in the second direction DR2. The portion of the third drain electrode DE3 protruding downward in the second direction DR2 may be disposed in parallel with the third source electrode SE3. The third drain electrode DE3 may be electrically connected to the second drain electrode DE2 of the second switching element T2. The third drain electrode DE3 may be physically connected to the second drain electrode DE2 of the second switching element T2, and may be integrally formed with the second drain electrode DE2.

The first color pixel SPX1 may include a first sub-pixel electrode 191 and a second sub-pixel electrode 192.

The first sub-pixel electrode 191 may be mostly disposed in the first sub-pixel area FSPX1, and the second sub-pixel electrode 192 may be mostly disposed in the second sub-pixel area FSPX2. The first sub-pixel electrode 191 may be electrically connected to the first drain electrode DE1 through a first contact hole CNT1. The second sub-pixel electrode 192 may be electrically connected to the second drain electrode DE2 through a third contact hole CNT3.

The first sub-pixel electrode 191 may include a first stem portion 191a disposed in the first sub-pixel area FSPX1, a plurality of first branch portions 191b disposed on the first sub-pixel area FSPX1, extending outward from the first stem portion 191a, and spaced apart from each other with a slit 191c interposed therebetween, and a first extension portion 191d extending from the first sub-pixel area FSPX1 to the switching element area TA.

The first stem portion 191a may include a horizontal stem portion extending in the first direction DR1 and a vertical stem portion extending in the second direction DR2. The first stem portion 191a may divide the first sub-pixel electrode 191 into sub-areas, such as domains. The first stem portion 191a may have substantially a cross shape. In this case, the first sub-pixel electrode 191 may be divided into four sub-areas by the first stem portion 191a. The first branch portions 191b located in the respective sub-areas may have different extending directions from each other. For example, the first branch portion 191b located in the upper right direction of the sub-area may extend obliquely from the first stem portion 191a in the upper right direction, and the first branch portion 191b located in the lower right direction of the sub-area may extend obliquely from the first stem portion 191a in the lower right direction. Further, the first branch portion 191b located in the upper left direction of the sub-area may extend obliquely from the first stem portion 191a in the upper left direction, and the first branch portion 191b located in the lower left direction of the sub-area may extend obliquely in the lower left direction from the first stem portion 191a. The first extension portion 191d may extend from the first stem portion 191a or the first branch portion 191b to the switching element area TA to be connected to the first drain electrode DE1 through the first contact hole CNT1.

The second sub-pixel electrode 192 may include a second stem portion 192a disposed in the second sub-pixel area FSPX2, a plurality of second branch portions 192b disposed on the second sub-pixel area FSPX2, extending outward from the second stem portion 192a, and spaced apart from each other with a slit 192c interposed therebetween, and a second extension portion 192d extending from the second sub-pixel area FSPX2 to the switching element area TA.

Since the second stem portion 192a, the second branch portion 192b, and the second extension portion 192d are substantially the same as or similar to the first stem portion 191a, the first branch portion 191b, and the first extension portion 191d, respectively, repeated descriptions thereof will be omitted to avoid redundancy.

The planar size of the first sub-pixel electrode 191 may be less than the planar size of the second sub-pixel electrode 192. As used herein, the planar sizes of the sub-pixel electrodes 191 and 192 may be defined based on the width of the first direction DR1 and the width of the second direction DR2. The width of each of the sub-pixel electrodes 191 and 192 in the first direction DR1 on the plane may be defined as the shortest distance between adjacent data lines DL of the first color pixel SPX1 of each of the sub-pixel electrodes 191 and 192 in the first direction DR1. In the case of the first sub-pixel electrode 191, the width of each of the sub-pixel electrodes 191 and 192 in the second direction DR2 on the plane may be defined as the shortest distance between the first storage line CSTL1 of the first sub-pixel electrode 191 of the first color pixel SPX1 and a portion thereof extending in the second direction DR2. In the case of the second sub-pixel electrode 192, the width of each of the sub-pixel electrodes 191 and 192 in the second direction DR2 on the plane may be defined as the shortest distance between the second storage line CSTL2 closest to the main storage line unit and a portion thereof extending in the second direction DR2.

The first color pixel SPX1 may further include a blocking line EFS. The blocking line EFS may be disposed on the same layer as the aforementioned first and second sub-pixel electrodes 191 and 192, and may include substantially the same material. The blocking line EFS may be disposed to overlap at least a portion of each of the data line DL, the gate line SL, the first switching element T1, and the second switching element T2 to form a common electrode CE and a parasitic capacitor to be described later, thereby preventing the occurrence of liquid crystal driving failure.

Hereinafter, a cross-sectional structure of the above-described first color pixel SPX1 will be described with reference to FIG. 5.

Referring to FIG. 5, the display device according to an exemplary embodiment may include a first substrate SUB1 and a second substrate SUB2 facing the first substrate SUB1. The plurality of pixels PX described above may be disposed on the first substrate SUB1, and the common electrode CE may be disposed on the second substrate SUB2. A liquid crystal layer 300 including liquid crystals 310 may be disposed between the pixel PX of the first substrate SUB1 and the common electrode CE of the second substrate SUB2.

The first substrate SUB1 may include an insulating material, such as glass, quartz, or polymer resin. The polymer resin may include polyethersulphone (PES), polyacrylate (PA), polyarylate (PAR), polyetherimide (PEI), polyethylene napthalate (PEN), polyethylene tereptahalate (PET), polyphenylene sulfide (PPS), polyallylate, polyimide (PI), polycarbonate (PC), cellulose triacetate (CAT), cellulose acetate propionate (CAP), or a combination thereof. In some exemplary embodiment, the first substrate SUB1 may include a metal material.

A first conductive layer may be disposed on the first substrate SUB1. The first conductive layer may include a gate line SL, a first gate electrode GE1, a second gate electrode GE2, a third gate electrode GE3, and storage lines CSTL1 and CSTL2. The first gate electrode GE1 may be a gate electrode of the first switching element T1, the second gate electrode GE2 may be a gate electrode of the second switching element T2, and the third gate electrode GE3 may be a gate electrode of the switching element T3.

The gate line SL, the first gate electrode GE1, the second gate electrode GE2, the third gate electrode GE3, and the storage lines CSTL1 and CSTL2 may each be formed of a first conductive layer, may be located on the same layer, and may be made of the same material. The first conductive layer may be formed as a single layer or multiple layers. When the first conductive layer is formed as a single layer, the first conductive layer may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu), or an alloy thereof. In another exemplary embodiment, when the first conductive layer is formed as a multilayer, the first conductive layer may include the aforementioned materials. For example, the first conductive layer may be two layers of molybdenum/aluminum-neodymium, molybdenum/aluminum, or copper/titanium.

Each of the first gate electrode GE1, the second gate electrode GE2, and the third gate electrode GE3 may be electrically connected to the gate line SL. The first gate electrode GE1, the second gate electrode GE2, and the third gate electrode GE3 may be connected to each other, but the inventive concepts are not limited thereto. In an exemplary embodiment, the first gate electrode GE1, the second gate electrode GE2, and the third gate electrode GE3 may be a gate line SL.

A gate insulating layer GI is located on the gate line SL, the first gate electrode GE1, the second gate electrode GE2, the third gate electrode GE3, and the storage lines CSTL1 and CSTL2 to insulate these components. The gate insulating layer GI may include an inorganic insulating material, such as a silicon compound or a metal oxide. For example, the gate insulating layer GI may include silicon oxide, silicon nitride, silicon oxynitride, aluminum oxide, tantalum oxide, hafnium oxide, zirconium oxide, titanium oxide, or a combination thereof. The gate insulating layer GI may be formed as a single layer or multiple layers of different materials.

A semiconductor layer ACT is located on the gate insulating layer GI. The semiconductor layer ACT may include a first semiconductor area AP1, a second semiconductor area AP2, and a third semiconductor area AP3. The first semiconductor area AP1 may be defined as an area overlapping the first source electrode SE1, the first drain electrode DE1, and the first gate electrode GE1 of the first switching element T1. The second semiconductor area AP2 may be defined as an area overlapping the second source electrode SE2, the second drain electrode DE2, and the second gate electrode GE2 of the second switching element T2. The third semiconductor area AP3 may be defined as an area overlapping the third source electrode SE3, the third drain electrode DE3, and the third gate electrode GE3 of the third switching element T3.

The first semiconductor area AP1, the second semiconductor area AP1, and the third semiconductor area AP3 include channel regions CH1, CH2, and CH3, respectively. The first channel region CH1 may overlap the first gate electrode GE1 of the first switching element T1, the second channel region CH2 may overlap the second gate electrode GE2 of the second switching element T2, and the third channel region CH3 may overlap the third gate electrode GE3 of the third switching element T3. Each of the first channel region CH1, the second channel region CH2, and the third channel region CH3 may be a region where a channel is formed by inverting conductivity between the source electrode and the drain electrode of each switching element T1 when an electric field is applied by overlapping gate electrodes. The first semiconductor area AP1 to the third semiconductor area AP3 may be formed in one pattern.

In an exemplary embodiment, the semiconductor layer ACT may include a silicon-based semiconductor material, such as amorphous silicon, polycrystalline silicon, or monocrystalline silicon. In another exemplary embodiment, the semiconductor layer ACT may include monocrystalline silicon, low-temperature polycrystalline silicon, or amorphous silicon. The semiconductor layer ACT may include an oxide semiconductor. For example, the semiconductor layer may include a two-component compound (ABx), a three-component compound (ABxCy), or a four-component compound (ABxCyDz), each including indium (In), zinc (Zn), gallium (Ga), tin (Sn), titanium (Ti), aluminum (Al), hafnium (Hf), zirconium (Zr), or magnesium (Mg). The semiconductor layer ACT may include ITZO (oxide containing indium, tin, and zinc) or IGZO (oxide containing indium, gallium, and zinc).

In some exemplary embodiments the semiconductor layer ACT may further include an ohmic pattern including an ohmic contact layer. The ohmic contact layer may be located between the source electrode and drain electrode of each of the switching elements T1 to T3 described later and the semiconductor layer ACT, thereby reducing a Schottky barrier between metal and silicon, that is, a work function to reduce contact resistance. The ohmic contact layer may be made of amorphous silicon doped with n-type impurities at a high concentration.

A second conductive layer may be disposed on the first substrate SUB1 and the semiconductor layer ACT. The second conductive layer may include a data line DL, a source electrode, and a drain electrode of each of the switching elements T1, T2, and T3, and a partial voltage reference line. The data line DL and the source electrode and the drain electrode of each of the first to third switching elements T1, T2, and T3 may each be made of the second conductive layer, may be made of the same material as each other, and may be located on the same layer as each other.

The second conductive layer may be formed as a single layer or multiple layers. When the second conductive layer is formed as a single layer, the second conductive layer may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu), or an alloy thereof. Further, when the second conductive layer is formed as a multilayer, the second conductive layer may include the aforementioned materials. For example, the second conductive layer may be two layers of molybdenum/aluminum-neodymium, molybdenum/aluminum, or copper/titanium, or three layers of molybdenum/titanium/molybdenum or molybdenum/aluminum/molybdenum.

The first source electrode SE1 of the first switching element T1 may be electrically connected to the data line DL. The first source electrode SE1 of the first switching element T1 may be disposed on the semiconductor layer ACT, and may be electrically connected to the first semiconductor area AP1. The first drain electrode DE1 of the first switching element T1 may be disposed on the semiconductor layer ACT, and may be electrically connected to the first semiconductor area AP1.

The second source electrode SE2 of the second switching element T2 may be electrically connected to the data line DL. The second source electrode SE2 may be disposed on the semiconductor layer ACT, and may be electrically connected to the second semiconductor area AP2. The second drain electrode DE2 of the second switching element T2 may be disposed on the semiconductor layer ACT, and may be electrically connected to the second semiconductor area AP2.

The third source electrode SE3 of the third switching element T3 may be electrically connected to the first storage line CSTL1. The third source electrode SE3 according to an exemplary embodiment may be directly connected to the first storage line CSTL1 through a contact hole. The third source electrode SE3 may be disposed on the semiconductor layer ACT, and may be electrically connected to the third semiconductor area AP3. The third drain electrode DE3 of the third switching element T3 may disposed on the semiconductor layer ACT, and may be electrically connected to the third semiconductor area AP3.

The second conductive layer may be patterned simultaneously with the semiconductor layer ACT, and thus, the semiconductor layer ACT may have a similar shape under the second conductive layer, for example, the data line DL, the first to third source electrodes SE1, SE2, and SE3, the first to third drain electrodes DE1, DE2, and DE3, and the partial voltage reference line RL.

A color filter 112 may be disposed over the first substrate SUB1 on which the first switching element T1, the second switching element T2, and the third switching element T3 are formed. The color filter 112 may include a red color filter, a green color filter, and a blue color filter. The red color filter may be disposed in the first color pixel SPX1, the green color filter may be disposed in the second color pixel SPX2, and the blue color filter may be disposed in the third color pixel SPX3. The red color filter, the green color filter, and the blue color filter may overlap each other at the boundary of each of the color pixels SPX1, SPX2, and SPX3, but the inventive concepts are not limited thereto, and the color filters may not overlap each other in some exemplary embodiments. Since FIG. 5 illustrates a cross-section of the first color pixel SPX1, the color filter 112 may be a red color filter.

An insulating layer 113 may be disposed on the color filter 112. The insulating layer 113 may include an organic insulating material or an inorganic insulating material. The insulating layer 113 may be an overcoat layer.

A third conductive layer may be disposed on the insulating layer 113. The third conductive layer may include a first sub-pixel electrode 191, a second sub-pixel electrode 192, and a blocking line EFS. Since FIG. 5 illustrates the first extension portion 191d of the first sub-pixel electrode 191 of the first color pixel SPX1 and the blocking line EFS, hereinafter, the first extension portion 191d and the blocking line EFS will be described in more detail as an example.

The first extension portion 191d and the blocking line EFS may be formed of the third conductive layer. The third conductive layer may be made of a transparent material through which light may be transmitted. The third conductive layer may be made of, for example, indium tin oxide (ITO), indium zinc oxide (IZO), or indium tin zinc oxide (ITZO), without being limited thereto. The third conductive layer may include any material that is transparent and conductive.

The first drain electrode DE1 of the first switching element T1 may be electrically connected to the first extension portion 191d of the first sub-pixel electrode 191. The insulating layer 113 and the color filter 112 may include a first contact hole CNT1 penetrating in the thickness direction. The first extension portion 191d of the first sub-pixel electrode 191 may be electrically connected to the first drain electrode DE1 of the first switching element T1 through the first contact hole CNT1.

The second substrate SUB2 facing the first substrate SUB1 may include a light blocking member BM and a common electrode CE.

The second substrate SUB2, similarly to the first substrate SUB1, may be a transparent insulating substrate. The second substrate SUB2 may include a polymer or plastic having high heat resistance. The second substrate SUB2 may have flexibility.

The light blocking member BM may be disposed on one surface of the second substrate SUB2 facing the first substrate SUB1. The light blocking member BM may overlap the switching element area TA. The light blocking member BM may include a light blocking pigment, such as carbon black or an opaque material, such as chromium (Cr), and may include a photosensitive organic material. However, the inventive concepts are not limited thereto, and in some exemplary embodiments, the light blocking member BM may be located on the first substrate SUB1.

The common electrode CE may be disposed on one surface of the light blocking member BM facing the first substrate SUB1. The common electrode CE may be made of a transparent conductive material, such as indium tin oxide (ITO), indium zinc oxide (IZO), or indium tin zinc oxide (ITZO). The common electrode CE may be formed over substantially the entire surface of the second substrate SUB2.

A liquid crystal layer 300 may be disposed between the first substrate SUB1 and the second substrate SUB2. The liquid crystal layer 300 may include liquid crystals 310 having dielectric anisotropy.

A common voltage may be applied to the common electrode CE to form an electric field together with the first sub-pixel electrode 191 and the second sub-pixel electrode 192. In this case, the arrangement of the liquid crystals 310 in the liquid crystal layer 300 may be changed according to the magnitude of the electric field, so that light transmittance may be controlled.

More particularly, when an electric field is formed in the liquid crystal layer 300 between the first substrate SUB1 and the second substrate SUB2, the liquid crystals 310 may rotate in a specific direction between the first substrate SUB1 and the second substrate SUB2 to adjust a phase delay value of light passing through the liquid crystal layer 300. The amount of polarized light (for example, light having passed through a lower polarization member) passing through an upper polarization member (disposed at light exit side and attached to the outer surface of the second substrate) changes depending on how different the phase delay value is due to the rotation of the liquid crystals 310, thereby controlling transmittance.

The third source electrode SE3 of the third switching element T3 may be electrically connected to the first storage line CSTL1, and the second drain electrode DE2 of the second switching element T2 may be electrically connected to the second sub-pixel electrode 192.

In particular, referring to FIGS. 4 and 6, the first storage line CSTL1 and the second storage line CSTL2 may be spaced apart from each other on the first substrate SUB1, and the gate line SL may be disposed between the first storage line CSTL1 and the second storage line CSTL2. The gate insulating layer GI may be disposed on the first storage line CSTL1, the second storage line CSTL2, and the gate line SL.

The third source electrode SE3 and the third drain electrode DE3 of the third switching element T3 may be spaced apart from each other on the gate insulating layer GI. The third source electrode SE3 may overlap the first storage line CSTL1, and the third drain electrode DE3 may overlap the second storage line CSTL2 to form a predetermined capacitor. The third source electrode SE3 and the third drain electrode DE3 may be spaced apart from each other with the gate line SL interposed therebetween.

The color filter 112 may be disposed on the first substrate SUB1 on which the third source electrode SE3 and the third drain electrode DE3 are formed, and the insulating layer 113 may be disposed on the color filter 112. The first electrode pattern 193 and the second extension portion 192*d* of the second sub-pixel electrode 192 may be spaced apart from each other on the insulating layer 113.

As described above, the third source electrode SE3 may be electrically connected to the first storage line CSTL1. As such, the gate insulating layer GI and the insulating layer 113 disposed on the third source electrode SE3 may include a second contact hole CNT2. The second contact hole CNT2 may expose the first storage line CSTL1. The third source electrode SE3 may be electrically connected to the first storage line CSTL1 exposed by the second contact hole CNT2 through the first electrode pattern 193. The first electrode pattern 193 may be made of substantially the same material as the first and second sub-pixel electrodes 191 and 192, and may include a bridge pattern. The first electrode pattern 193 may directly contact the third source electrode SE3 and directly contact the first storage line CSTL1 to electrically connect the third source electrode SE3 and the first storage line CSTL1.

The second drain electrode DE2 of the second switching element T2 may be electrically connected to a second electrode pattern, in particular, the second sub-pixel electrode 192. As such, the insulating layer 113 disposed on the second drain electrode DE2 may include a third contact hole CNT3. The third contact hole CNT3 may expose the second drain electrode D2. The second extension portion 192*d* of the second sub-pixel electrode 192 may be electrically connected to the second drain electrode DE2 exposed by the third contact hole CNT3. The second extension portion 192*d* may directly contact the second drain electrode DE2 to be electrically connected to the second drain electrode DE2.

The above-described first contact hole CNT1, second contact hole CNT2, and third contact hole CNT3 may be disposed to overlap via holes (CFH1 and CFH2 in FIG. 7) of the color filter 112 disposed between the insulating layer 113 and the third source electrode SE3.

More particularly, referring to FIGS. 5 to 7, the first drain electrode DE1 of the first switching element T1 may be electrically connected to the first extension portion 191*d* of the first sub-pixel electrode through the first contact hole CNT1. The first contact hole CNT1 may be disposed to overlap the first via hole CFH1 of the color filter 112 disposed between the first drain electrode DE1 and the first extension portion 191*d*. The first via hole CFH1 may penetrate the color filter 112 to expose the lower layer, for example, the first drain electrode DE1. The first contact hole CNT1 may expose the first drain electrode DE1 through the first via hole CFH1. The first extension portion 191*d* may be electrically connected to the first drain electrode DE3 exposed through the first contact hole CNT1 and the first via hole CFH1.

The second contact hole CNT2 and the third contact hole CNT3 may be disposed to overlap the second via hole CFH2. The second via hole CFH2 may penetrate the color filter 112 to expose the lower layer, for example, the third source electrode SE3, the gate insulating layer GI, and the third drain electrode DE3. The second contact hole CNT2 may penetrate the gate insulating layer GI disposed between the third source electrode SE3 and the first storage line CSTL1 to expose the first storage line CSTL1 through the second via hole CFH2. The first electrode pattern 193 may contact the third source electrode SE3 and the first storage line CSTL1 exposed through the second contact hole CNT2 and the second via hole CFH2, respectively. The third contact hole CNT3 may penetrate the insulating layer 113 to expose the third drain electrode DE3. The second extension portion 192d of the second sub-pixel electrode may contact the third drain electrode DE3 exposed through the third contact hole CNT3 and the second via hole CFH2.

The second contact hole CNT2 and the third contact hole CNT3 may be disposed to overlap the second via hole CFH2. The second contact hole CNT2 and the third contact hole CNT3 may be disposed in the second via hole CFH2 in a plan view. The width (W4, width in the second direction DR2 of FIG. 3) of the second via hole CFH2 may be greater than each of the width (W5, width in the second direction DR2 of FIG. 3) of the second contact hole CNT2 and the width (W6, width in the second direction DR2 of FIG. 3) of the third contact hole CNT3. The width W4 of the second via hole CFH2 may be greater than the sum of the width W5 of the second contact hole CNT2 and the width W6 of the third contact hole CNT3. When the width W4 of the second via hole CFH2 is greater than the sum of the width W5 of the second contact hole CNT2 and the width W6 of the third contact hole CNT3, the second contact hole CNT2 and the third contact hole CNT3 may be disposed in one second via hole CFH2.

In an exemplary embodiment, the second contact hole CNT2 and the third contact hole CNT3 are disposed in one second via hole CFH2, and thus, the degree of freedom in the arrangement of the second contact hole CNT2 and the third contact hole CNT3 in the second via hole CFH2 may be increased. As such, the distance between the second contact hole CNT2 and the third contact hole CNT3 may decreased, and the area of the first sub-pixel electrode 191 may be increased, thereby improving the aperture ratio of the pixel.

The second via hole CFH2 may be disposed to overlap the gate line SL. The width W4 of the second via hole CFH2 may be disposed to cross the gate line SL. The second contact hole CNT2 and the third contact hole CNT3 may be disposed to not overlap the gate line SL. In particular, the second contact hole CNT2 and the third contact hole CNT3 may be disposed to be spaced apart from the gate line SL.

As shown in FIG. 7, the color filter 112 may be disposed in each of the color pixels SPX1, SPX2, and SPX3. For example, the first color filter 112R may be disposed in the first color pixel SPX1, the second color filter 112G may be disposed in the second color pixel SPX2, and the third color filter 113B may be disposed in the third color pixel SPX3. The first color filter 112R may be a red color filter, the second color filter 112G may be a green color filter, and the third color filter 112B may be a blue color filter.

Each of the color filters 112R, 112G, and 112B may include the first via hole CFH1 and the second via hole CFH2. The second via hole CFH2 may overlap the second contact hole CNT2 and the third contact hole CNT3, and the second contact hole CNT2 and the third contact hole CNT3 may be disposed in the second via hole CFH2.

When a plurality of via holes of the color filter 112 is arranged, each of the via holes may need to be spaced apart from each other by a minimum distance. In an exemplary embodiment, the second contact hole CNT2 and the third contact hole CNT3 are disposed in one second via hole CFH2, and thus, the degree of freedom in the arrangement of the second contact hole CNT2 and the third contact hole CNT3 in the second via hole CFH2 may be increased. Accordingly, the distance between the second contact hole CNT2 and the third contact hole CNT3 may be decreased, and the area of the first sub-pixel electrode 191 may be increased, thereby improving the aperture of the pixel.

Figure 8:
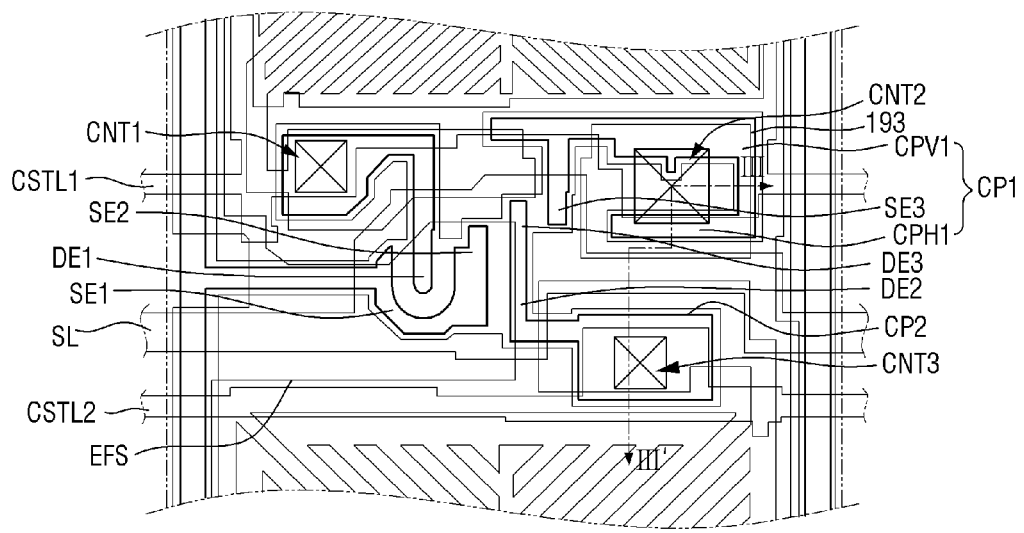
FIGS. 8 and 9 are plan views each illustrating one pixel according to another exemplary embodiment.
Figure 9:
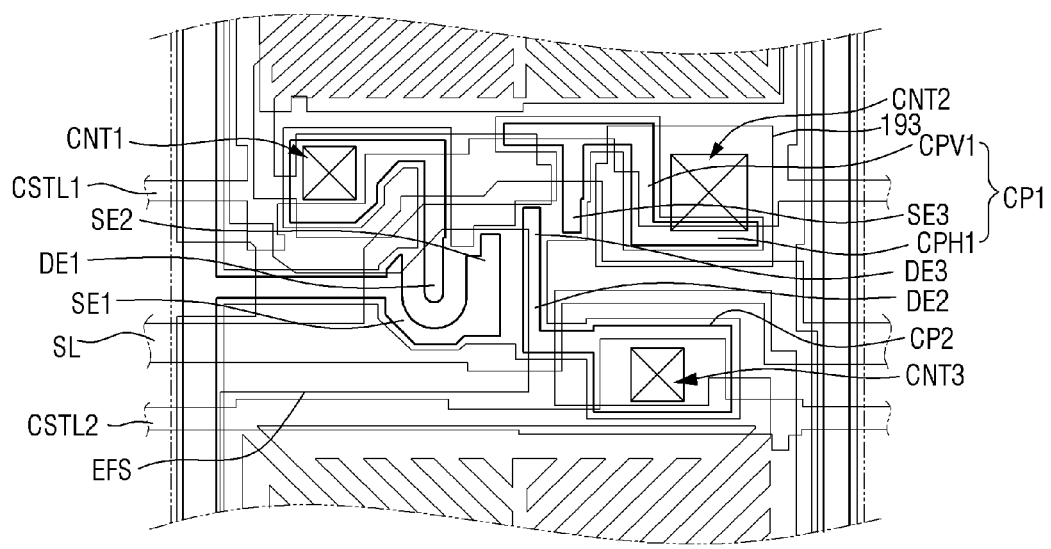
Figure 10:
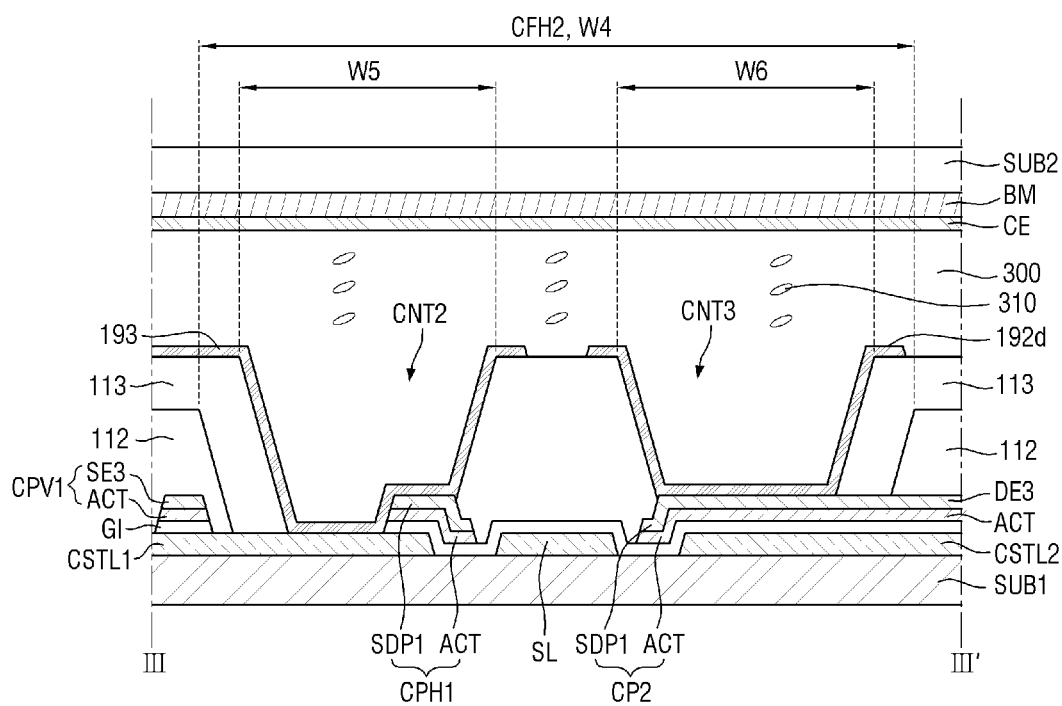
FIG. 10 is a cross-sectional view taken along line III-III' of FIG. 8.

FIGS. 8 and 9 are plan views each illustrating one pixel according to exemplary embodiments, and FIG. 10 is a cross-sectional view taken along line III-III' of FIG. 8. In the following exemplary embodiments, repeated descriptions of the same elements and configurations as those shown in FIGS. 4 to 6 will be omitted.

Referring to FIGS. 8 and 9, the display device 1 according to another exemplary embodiment may further include first and second conductive patterns CP1 and CP2 overlapping the second via hole CFH2 of the color filter 112.

The first conductive pattern CP1 may be a portion where one end of the third source electrode SE3 extends. The first conductive pattern CP1 may extend from one end of the third source electrode SE3 to surround the second contact hole CNT2. The first conductive pattern CP1 may include a first vertical portion CPV1 extending from one end of the third source electrode SE3 in the second direction and a first horizontal portion CPH1 extending from the first vertical portion CPV1 in the first direction. The first vertical portion CPV1 may extend in a direction from one end of the third source electrode SE3 adjacent to the data line SL of the adjacent color pixel toward the gate line. The first horizontal portion CPH1 may be adjacent to the third switching element T3 from one end of the first vertical portion CPV1 and may extend in a direction parallel to the gate line SL. The first vertical portion CPV1 and the first horizontal portion CPH1 may overlap the underlying first storage line CSTL1, and may not overlap the gate line SL.

In another exemplary embodiment, as shown in FIG. 9, the first vertical portion CPV1 of the first conductive pattern CP1 may extend in a direction from one end of the third source electrode SE3 adjacent to the third switching element T3 toward the adjacent gate line SL. The first horizontal portion CPH1 may extend from one end of the first vertical portion CPV1 toward the data line of the adjacent color pixel. The first vertical portion CPV1 and the first horizontal portion CPH1 may overlap the underlying first storage line CSTL1. The first conductive pattern CP1 may not overlap the gate line SL to prevent the formation of an unintended capacitor. The shapes of the first vertical portion CPV1 and the first horizontal portion CPH1 of the first conductive pattern CP1 are not limited to those illustrated in FIGS. 8 and 9. The first vertical portion CPV1 and the first horizontal portion CPH1 of the first conductive pattern CP1 may have any shape as long as the first conductive pattern CP1 overlaps the first storage line CSTL1 and does not overlap the gate line SL.

Referring again to FIG. 8, the second conductive pattern CP2 may be a portion extending from the third drain electrode DE3 of the third switching element T3. The second conductive pattern CP2 may extend from one end of the third drain electrode DE3 toward the adjacent gate line SL. The second conductive pattern CP2 may overlap the underlying second storage line CSTL2 and may not overlap the gate line SL.

As shown in FIG. 10, the first conductive pattern CP1 and the second conductive pattern CP2 may be disposed on the gate insulating layer GI in a cross-sectional view of the second via hole CFH2.

More particularly, the gate insulating layer GI may be disposed over the first substrate SUB1, on which the first storage line CSTL1, the second storage line CSTL2, and the gate line SL are disposed. The first conductive pattern CP1 and the second conductive pattern CP2 may be disposed on the gate insulating layer GI. The first conductive pattern CP1 may at least partially overlap the first storage line CSTL1 and may not overlap the gate line SL. The second conductive pattern CP1 may at least partially overlap the second storage line CSTL2 and may not overlap the gate line SL.

The first conductive pattern CP1 and the second conductive pattern CP2 may overlap the second via hole CFH2. At least a portion of the first conductive pattern CP1 (e.g., the first horizontal portion CPH1) may be exposed by the second contact hole CNT2, and the other part thereof (e.g., the first vertical portion CPV1) may overlap the color filter 112. Accordingly, the first conductive pattern CP1 may contact the first electrode pattern 193 disposed on the insulating layer 113 through the second contact hole CNT2. At least a portion of the second conductive pattern CP2 may be exposed by the third contact hole CNT3 and the other part thereof may overlap the insulating layer 113. Accordingly, the second conductive pattern CP2 may contact the extension portion 192d of the second sub-pixel electrode 192, which is the second electrode pattern disposed on the insulating layer 113, through the third contact hole CNT3.

The first conductive pattern CP1 and the second conductive pattern CP2 may have a structure in which the semiconductor layer ACT and the source pattern SDP1 are stacked. The semiconductor layer ACT and the source pattern SDP1 may be patterned by the same etching process, so that the first conductive pattern CP1 and the second conductive pattern CP2 may have a structure in which the semiconductor layer ACT and the source pattern SDP1 are stacked. The source pattern SDP1 may be disposed at the same level with the same material as the second conductive layer described above.

In the illustrated exemplary embodiment, the first conductive pattern CP1 and the second conductive pattern CP2 may increase adhesion to the insulating layer 113. For example, the insulating layer 113 may be made of an organic material. The color filter 112 may be patterned under the insulating layer 113 to form the second via hole CFH2. However, when the color filter material is retained on the gate insulating layer GI in the second via hole CFH2, the adhesion between the insulating layer 113 and the gate insulating layer GI is lowered, which may cause the insulating layer 113 to be torn. In particular, when the gate line SL exists in the second via hole CFH2, in the area where the gate line SL is disposed, a material layer for color filters is relatively thin, and in the area where the gate line SL is not disposed, the material layer for color filters is relatively thick, thereby causing a thickness difference. In the process of patterning and removing the material layer for color filters, the material layer for color filters in the area where the thick gate line SL is not disposed may not be properly removed, and thus, materials for color filters may be retained.

Further, when the gate insulating layer GI is not properly formed at the corner of the gate line SL, the insulating layer 113 may be torn and the gate line SL may be exposed due to the remaining materials of the color filters described above. In this case, the exposed gate line SL may corrode during the process, and may be shorted with the first electrode pattern 193 described above.

In the illustrated exemplary embodiment, since the first conductive pattern CP1 and the second conductive pattern CP2 may be disposed on the gate insulating layer GI adjacent to the gate line SL and not overlapping the gate line SL, even when the materials for color filters may be retained on the first conductive pattern CP1 and the second conductive pattern CP2, which are made of metal, the adhesion between the insulating layer 113 and the first conductive pattern CP1 and between the insulating layer 113 and the second conductive pattern CP2 may be excellent, thereby preventing the insulating layer 113 from being torn. Accordingly, corrosion of the gate line SL may be prevented, and short between the gate line SL and the first electrode pattern 193 may be prevented.

Figure 11:
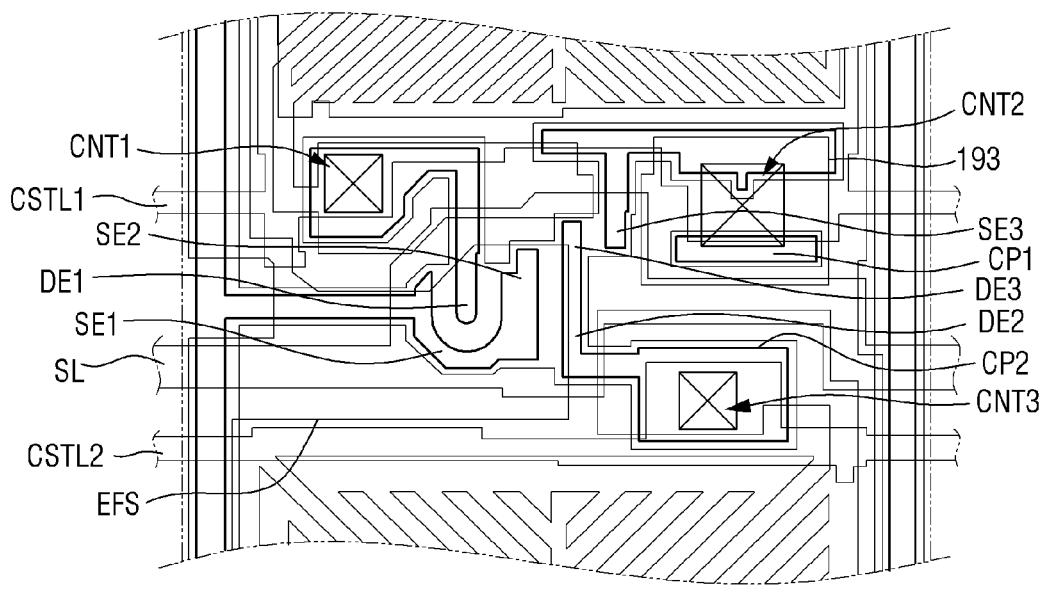
FIG. 11 is a plan view of one pixel according to another exemplary embodiment.

FIG. 11 is a plan view of one pixel according to another exemplary embodiment. In the illustrated exemplary embodiment, the structure of the pixel is substantially the same as that of FIG. 10, except for the shape of the first conductive pattern CP1. As such, the first conductive pattern CP1 will hereinafter be mainly described, and repeated descriptions of similar structures already described above with respect to FIG. 10 will be omitted. Further, since the cross-sectional structure of the second via hole according to the illustrated exemplary embodiment is substantially the same as that of FIG. 10 described above, the second via hole will be described with reference to FIG. 10.

Referring to FIGS. 10 and 11, the display device 1 according to the illustrated exemplary embodiment may include a first conductive pattern CP1 spaced apart from the third source electrode SE3.

The first conductive pattern CP1 may be disposed in the second via hole CFH2 of the color filter 112, and may be spaced apart from the third source electrode SE3. The first conductive pattern CP1 may be disposed in a second direction, for example, in parallel to the gate line SL. The first conductive pattern CP1 may be an island pattern and may not be electrically connected to other adjacent electrodes. The first conductive pattern CP1 may overlap the underlying first storage line CSTL1, and may not overlap the gate line SL.

Although the first conductive pattern CP1 is shown as having a bar shape parallel to the gate line SL in FIG. 11, however, the inventive concepts are not limited thereto, and the first conductive pattern CP1 may be an island pattern having substantially "L" shape, for example. The first conductive pattern CP1 may have any shape as long as it has an island pattern, overlaps the first storage line CSTL1, and does not overlap the gate line SL.

The first conductive pattern CP1 may be disposed on the gate insulating layer GI. The first conductive pattern CP1 may at least partially overlap the first storage line CSTL1, and may not overlap the gate line SL. The first conductive pattern CP1 may be disposed in the second via hole CFH2. At least a portion of the first conductive pattern CP1 may be exposed by the second contact hole CNT2, and the other part thereof may overlap the insulating layer 113. As such, the first conductive pattern CP1 may contact the first electrode pattern 193 disposed on the insulating layer 113 through the second contact hole CNT2.

In the illustrated exemplary embodiment, since the first conductive pattern CP1 and the second conductive pattern CP2, each being an island pattern, may be disposed on the gate insulating layer GI adjacent to the gate line SL and not overlapping the gate line SL, even when the materials for color filters remain on the first conductive pattern CP1 and the second conductive pattern CP2, which are made of metal, the adhesion between the insulating layer 113 and the first conductive pattern CP1 and between the insulating layer 113 and the second conductive pattern CP2 may be excellent. In this manner, the insulating layer 113 may be prevented from being torn. Accordingly, corrosion of the gate line SL may be prevented, and short between the gate line SL and the first electrode pattern 193 may also be prevented.

Figure 12:
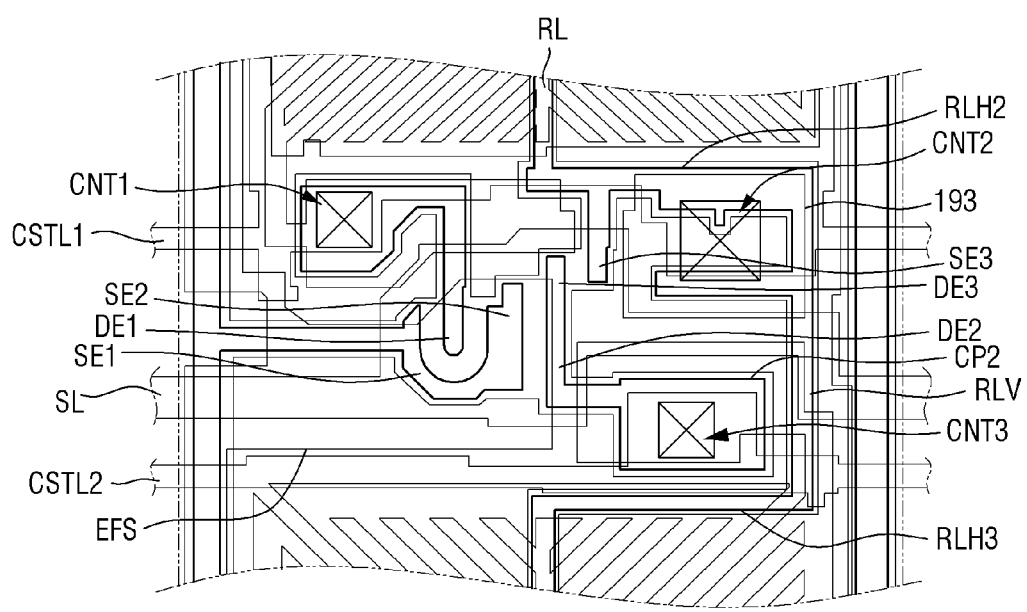
FIG. 12 is a plan view of one pixel according to another exemplary embodiment.

FIG. 12 is a plan view of one pixel according to another exemplary embodiment. In the illustrated exemplary embodiment, the pixel will be described with reference to the third color pixel SPX3. In the illustrated exemplary embodiment, since the partial voltage reference line RL is additionally included and the first conductive pattern CP1 has a different shape from that shown in FIG. 8, the partial voltage reference line RL and the first conductive pattern CP1 will be mainly described, and repeated descriptions of similar structures already described above will be omitted. Further, since the cross-sectional structure of the second via hole according to the illustrated exemplary embodiment is substantially the same as that shown in FIG. 10, the structure of the second via hole will be described with reference to FIG. 10.

The third color pixel SPX3 may include a first switching element T1, a second switching element T2, and a third switching element T3. The third source electrode SE3 of the third switching element T3 may be connected to the partial voltage reference line RL through the second contact hole CNT2.

The partial voltage reference line RL may cross the first sub-pixel electrode 191, the switching element area TA, and the second sub-pixel electrode 192, and may extend in the second direction (e.g., in a direction parallel with the data line DL).

More particularly, the partial voltage reference line RL may include a second horizontal portion RLH2 extending in a direction parallel to the gate line SL in the switching element area TA, a second vertical portion RLV extending in a direction crossing the gate line SL at one end of the second horizontal portion RLH, and a third horizontal portion RLH3 extending in a direction parallel to the gate line SL at one end of the second vertical portion RLV.

The second horizontal portion RLH2 may be a portion disposed between the first sub-pixel electrode 191 and the gate line SL. The second vertical portion RLV may be a portion extending in a direction intersecting the gate line SL from one end of the second horizontal portion RLH2 adjacent to the data line of the adjacent color pixel. The third horizontal portion RLH3 may be a portion extending from one end of the second vertical portion RLV adjacent to the second sub-pixel electrode 192 toward the data line of the third color pixel SPX3.

The partial voltage reference line RL may include a third source electrode SE3 of the third switching element T3 protruding and extending from a portion of the second horizontal portion RLH2. The third source electrode SE3 may protrude and extend in a direction intersecting the gate line SL in a portion of the second horizontal portion RLH2.

The partial voltage reference line RL may include a first conductive pattern CP1 protruding and extending from a portion of the second vertical portion RLV. The first conductive pattern CP1 may protrude and extend from a portion of the second vertical portion RLV toward the third source electrode SE3. The first conductive pattern CP1 may be disposed in the second via hole CFH2 of the color filter 112, and may be spaced apart from the third source electrode SE3. The first conductive pattern CP1 may be disposed in the second direction, for example, in a direction parallel to the gate line SL. The first conductive pattern CP1 may overlap the underlying first storage line CSTL1, and may not overlap the gate line SL.

Although the first conductive pattern CP1 is shown as having a bar shape parallel to the gate line SL in FIG. 12, however, the inventive concepts are not limited thereto, and the first conductive pattern CP1 may have substantially "L", for example. The first conductive pattern CP1 may have any shape as long as it protrudes from the second vertical portion RLV of the partial voltage reference line RL, overlaps the first storage line CSTL1, and does not overlap the gate line SL.

As shown in FIG. 10, the first conductive pattern CP1 may be disposed on the gate insulating layer GI. More particularly, the first conductive pattern CP1 may at least partially overlap the first storage line CSTL1 and may not overlap the gate line SL. The first conductive pattern CP1 may be disposed to overlap the second via hole CFH2. At least a portion of the first conductive pattern CP1 may be exposed by the second contact hole CNT2, and the other part thereof may overlap the insulating layer 113. As such, the first conductive pattern CP1 may contact the first electrode pattern 193 disposed on the insulating layer 113 through the second contact hole CNT2.

In the illustrated exemplary embodiment, since the first conductive pattern CP1 and the second conductive pattern CP2, each protruding and extending from the partial voltage reference line RL, may be disposed on the gate insulating layer GI adjacent to the gate line SL and not overlapping the gate line SL, even when the materials for color filters remain on the first conductive pattern CP1 and the second conductive pattern CP2, which are made of metal, the adhesion between the insulating layer 113 and the first conductive pattern CP1 and between the insulating layer 113 and the second conductive pattern CP2 may be excellent. In this manner, the insulating layer 113 may be prevented from being torn. Accordingly, corrosion of the gate line SL may be prevented, and short between the gate line SL and the first electrode pattern 193 may also be prevented.

Figure 13:
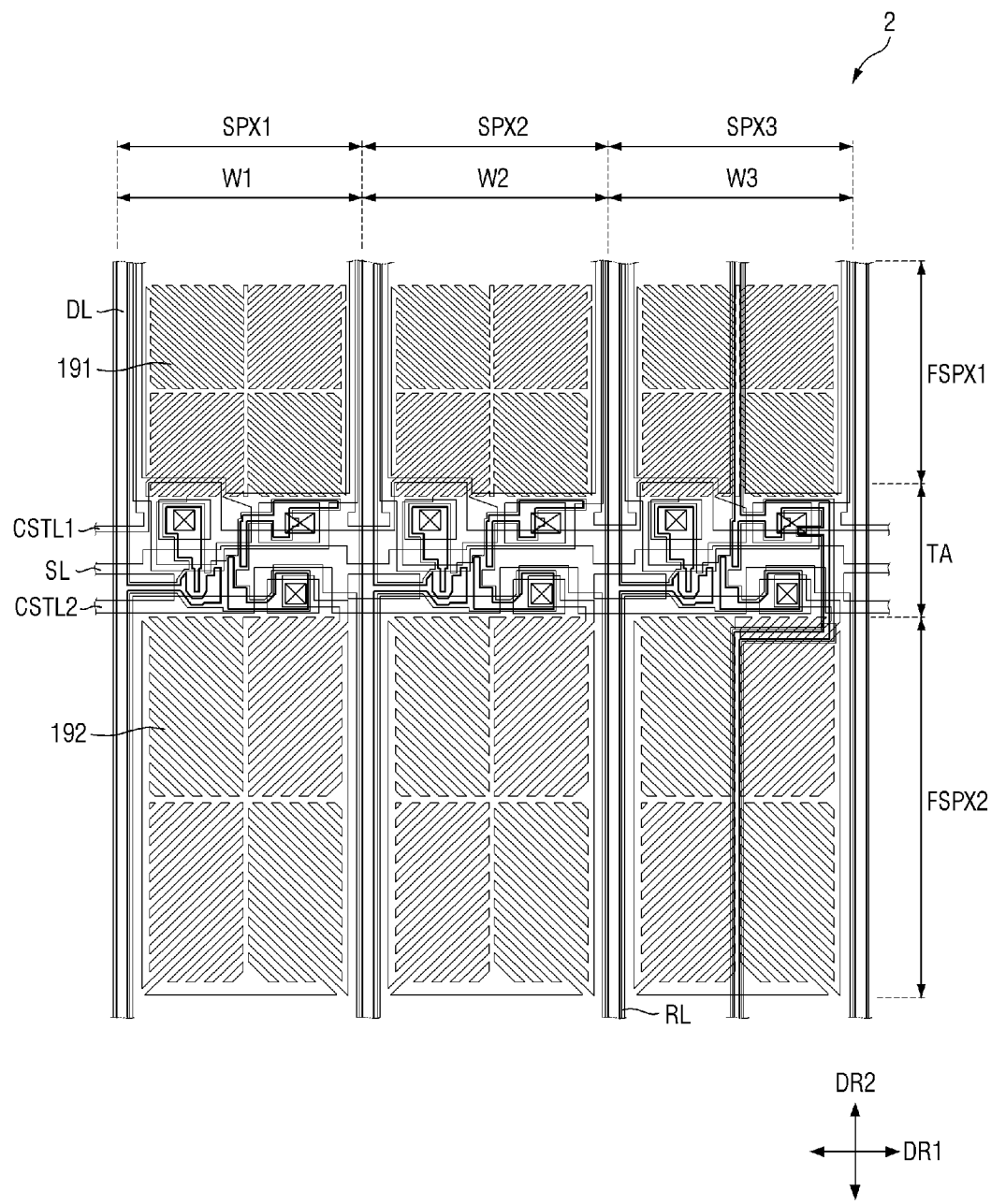
FIG. 13 is a plan view illustrating the pixels of a display device according to another exemplary embodiment.
Figure 14:
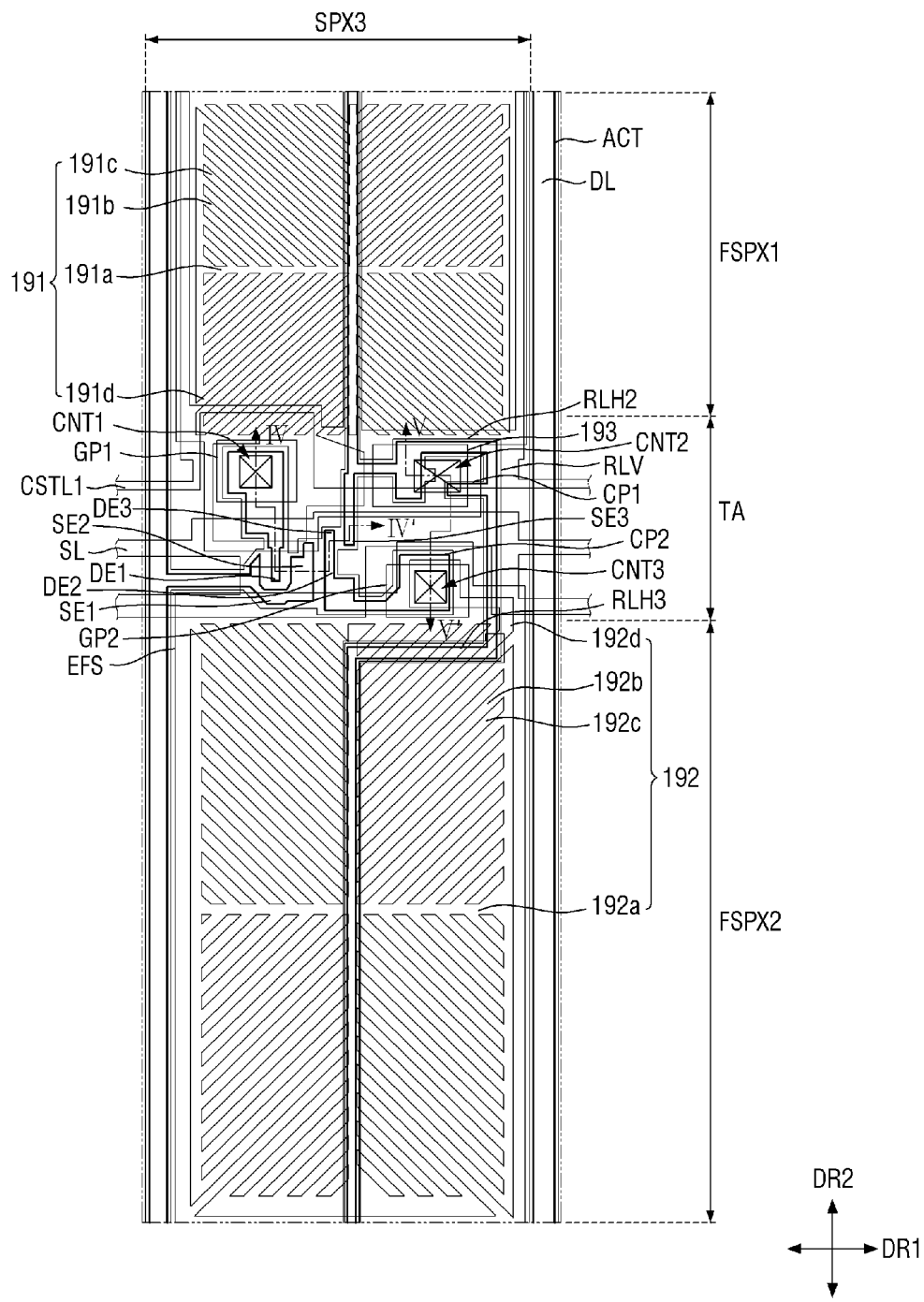
FIG. 14 is an enlarged plan view of the third color pixel of FIG. 13.
Figure 15:
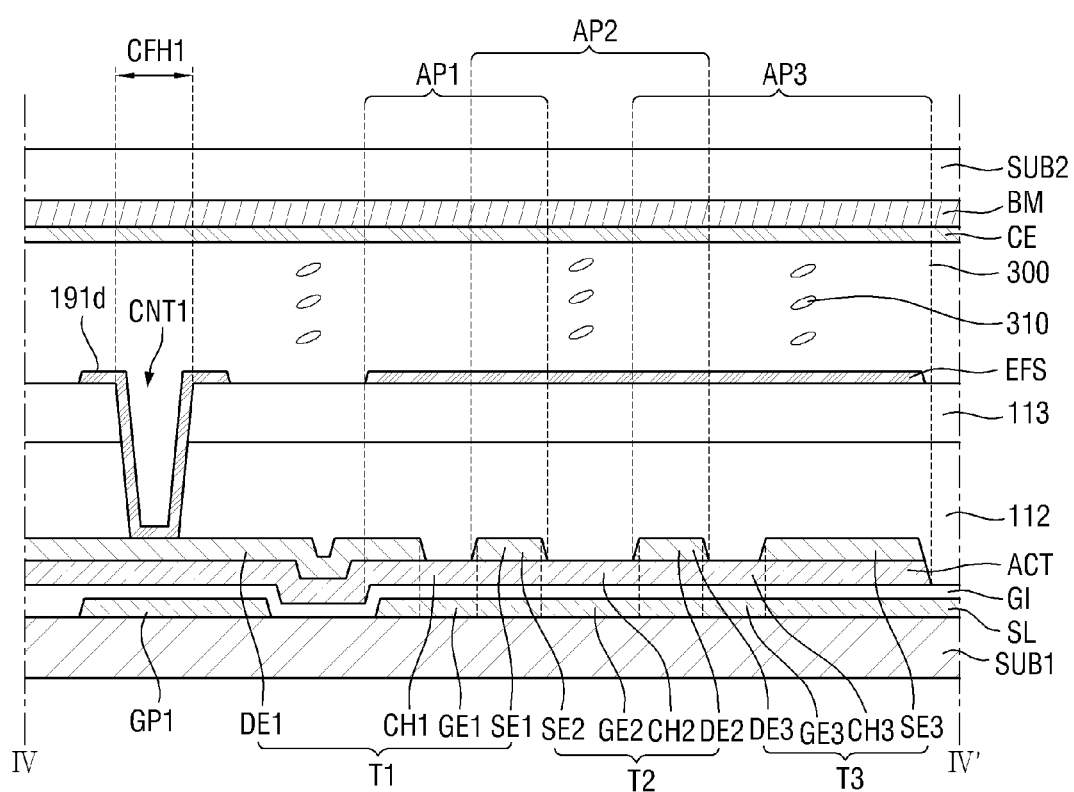
FIG. 15 is a cross-sectional view taken along line IV-IV' of FIG. 14.
Figure 16:
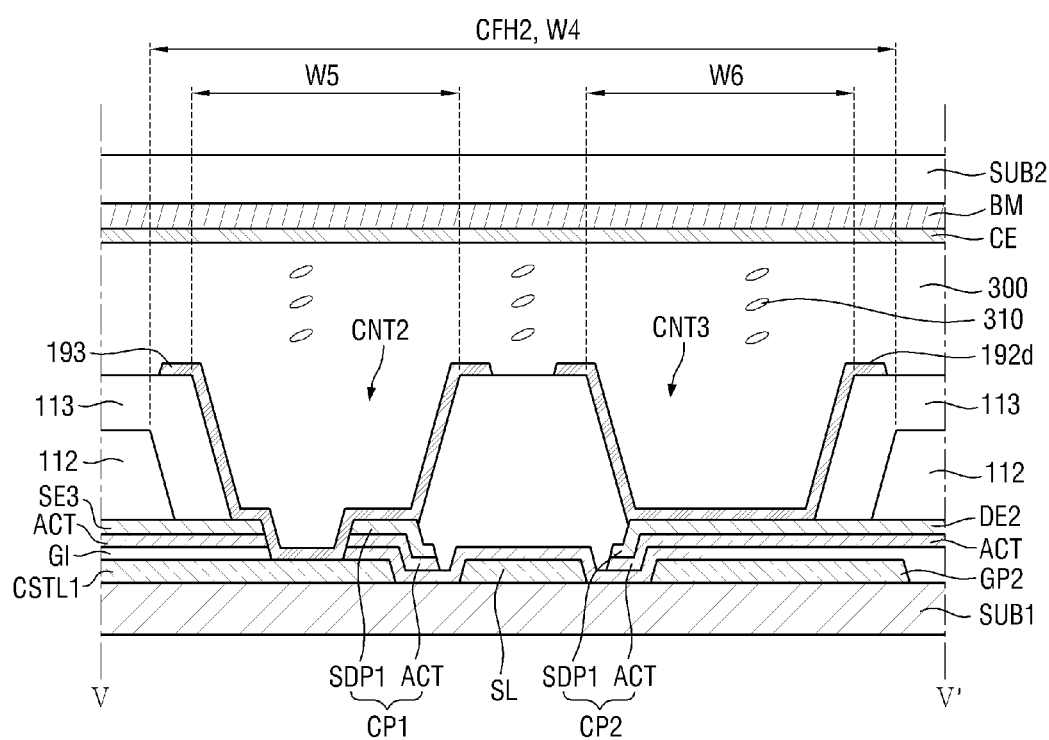
FIG. 16 is a cross-sectional view taken along line V-V' of FIG. 14.
Figure 17:
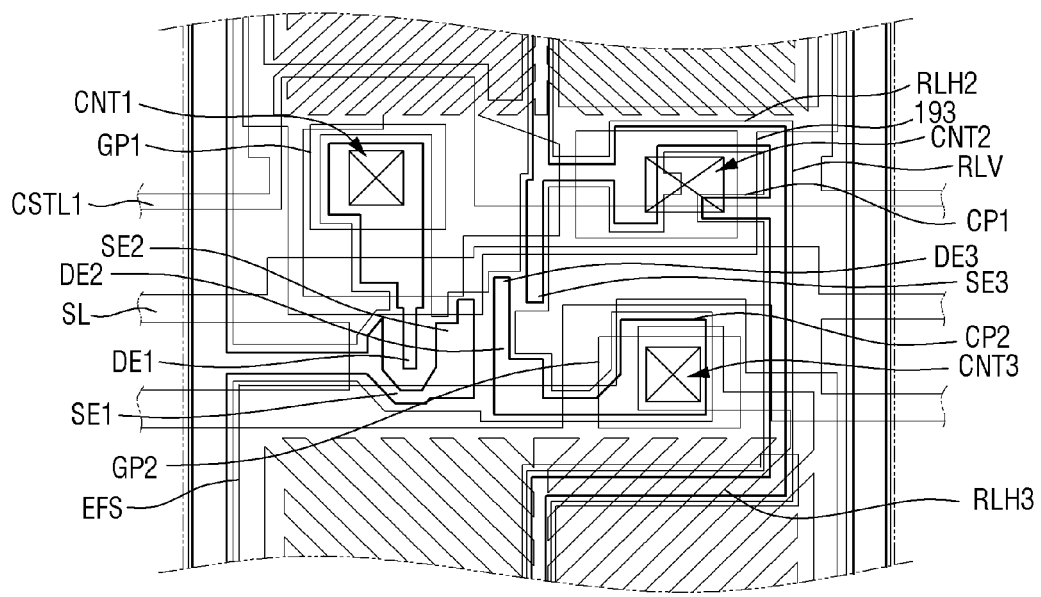
FIG. 17 is a plan view illustrating a third color pixel according to another exemplary embodiment.

FIG. 13 is a plan view illustrating the pixels of a display device according to another exemplary embodiment, FIG. 14 is an enlarged plan view of the third color pixel of FIG. 13, FIG. 15 is a cross-sectional view taken along line IV-IV' of FIG. 14, FIG. 16 is a cross-sectional view taken along line V-V' of FIG. 14, and FIG. 17 is a plan view illustrating a third color pixel according to another exemplary embodiment.

The pixels shown in FIG. 13 may have substantially the same configuration as the pixels shown in FIG. 3, except for some differences, such as a partial omission of the storage line. Hereinafter, substantially the same configuration will be briefly described, and the differences will be described in more detail.

Referring to FIG. 13, each pixel PX may include a plurality of color pixels SPX1, SPX2, and SPX3. The data line DL, the gate line SL, and the first storage line CSTL1 may pass through each of the color pixels SPX1, SPX2, and SPX3. In the illustrated exemplary embodiment, the second storage line CSTL2 shown in FIG. 3 may be omitted to improve aperture ratio and reduce external light reflection. The same gate line SL and the first storage line CSTL1 may commonly pass through each of the color pixels SPX1, SPX2, and SPX3 of one pixel PX.

Each of the color pixels SPX1, SPX2, SPX3 may be divided into a plurality of areas. Sub-pixel areas FSPX1 and FSPX2 and a switching element area TA may be defined in each of the color pixels SPX1, SPX2, and SPX3. A first sub-pixel electrode 191 may be disposed in the first sub-pixel area FSPX1 of each of the color pixels SPX1, SPX2, and SPX3, and a second sub-pixel electrode 192 may be disposed in the second sub-pixel area FSPX2 of each of the color pixels SPX1, SPX2, and SPX3. The first storage line CSTL1 may be disposed between the first sub-pixel electrode 191 and the second sub-pixel electrode 192, and the gate line SL may be disposed between the first storage line CSTL1 and the second sub-pixel electrode 192.

A partial voltage reference line RL extending along the second direction DR2 may further pass through the third color pixel SPX3. Since the partial voltage reference line RL is electrically connected to the first storage line CSTL1 to be described later, the voltage applied through the partial voltage reference line RL is transmitted to the first storage line CSTL1, and the first storage line CSTL1 is commonly connected to the respective color pixels SPX1, SPX2, SPX3 of the pixel PX, so that the same storage voltage may be applied to each of the color pixels SPX1, SPX2, and SPX3 of the pixel PX.

Referring to FIG. 14, the third color pixel SPX3 may include a first switching element T1, a second switching element T2, and a third switching element T3.

The first source electrode SE1 of the first switching element T1 may be connected to the data line DL, and the first drain electrode DE1 of the first switching element T1 may be connected to the first sub-pixel electrode 191 through the first contact hole CNT1. The second source electrode SE2 of the second switching element T2 may be connected to the data line DL, and may be integrally formed with the first source electrode SE1. The second drain electrode DE2 of the second switching element T1 may be connected to the second sub-pixel electrode 192 through the third contact hole CNT3. The third source electrode SE3 of the third switching element T3 may protrude and extend from the partial voltage reference line RL. The third drain electrode DE3 of the third switching element T3 may be integrally formed with the second drain electrode DE2. The gate electrodes of the above-described first to third switching elements T1, T2, and T3 may be gate lines SL.

The first drain electrode DE1 of the first switching element T1 may overlap the underlying first gate pattern GP1, and the second drain electrode DE2 of the second switching element T2 may overlap the underlying second gate pattern GP2. The first gate pattern GP1 and the second gate pattern GP2 may be disposed on the same layer as the gate line SL, and may be made of the same material. Each of the first gate pattern GP1 and the second gate pattern GP2 may formed as an island pattern to block light incident from the bottom. A portion of each of the first drain electrode DE1 and the second drain electrode DE2 may not overlap the gate line SL and the first storage line CSTL1. The semiconductor layer ACT is disposed under the first drain electrode DE1 and the second drain electrode DE2. When light is applied to the semiconductor layer ACT, a carrier of the semiconductor layer ACT is activated to change electrical characteristics, thereby changing the capacity of a capacitor. As such, the first gate pattern GP1 and the second gate pattern GP2 according to the illustrated exemplary embodiment may be disposed under the first drain electrode DE1 and the second drain electrode DE2 to overlap the first drain electrode DE1 and the second drain electrode DE2, thereby blocking light incident from the bottom.

The third color pixel SPX3 may include a first sub-pixel electrode 191 and a second sub-pixel electrode 192.

The first sub-pixel electrode 191 may be mostly disposed in the first sub-pixel area FSPX1, and the second sub-pixel electrode 192 may be mostly disposed in the second sub-pixel area FSPX2. The first sub-pixel electrode 191 may be electrically connected to the first drain electrode DE1 through the first contact hole CNT1. The second sub-pixel electrode 192 may be electrically connected to the second drain electrode DE2 through the third contact hole CNT3.

The first sub-pixel electrode 191 may include a first stem portion 191a disposed in the first sub-pixel area FSPX1, a plurality of first branch portions 191b disposed in the first sub-pixel area FSPX1, extending outward from the first stem portion 191a, and spaced apart from each other with the slits 191c interposed therebetween, and a first extension portion 191d extending from the first sub-pixel area FSPX1 to the switching element area TA. The second sub-pixel electrode 192 may include a second stem portion 192a disposed in the second sub-pixel area FSPX2, a plurality of second branch portions 192b disposed in the second sub-pixel area FSPX2, extending outward from the second stem portion 192a, and spaced apart from each other with the slits 192c interposed therebetween, and a second extension portion 192d extending from the second sub-pixel area FSPX2 to the switching element area TA.

The third source electrode SE3 of the third switching element T3 may protrude and extend from the partial voltage reference line RL. The partial voltage reference line RL may be connected to the first storage line CSTL1 through the second contact hole CNT2.

The partial voltage reference line RL may cross the first sub-pixel electrode 191, the switching element area TA, and the second sub-pixel electrode 192, and extend in the second direction (e.g., in a direction parallel with the data line DL).

More particularly, the partial voltage reference line RL may include a second horizontal portion RLH2 extending in a direction parallel to the gate line SL in the switching element area TA, a second vertical portion RLV extending in a direction crossing the gate line SL at one end of the second horizontal portion RLH2, and a third horizontal portion RLH3 extending in a direction parallel to the gate line SL at one end of the second vertical portion RLV.

The partial voltage reference line RL may include a first conductive pattern CP1 protruding and extending from a portion of the second vertical portion RLV. The first conductive pattern CP1 may protrude and extend from a portion of the second vertical portion RLV toward the third source electrode SE3. The first conductive pattern CP1 may be disposed in the second via hole CFH2 of the color filter 112, and may be spaced apart from the third source electrode SE3. The first conductive pattern CP1 may be disposed in the second direction, for example, in a direction parallel to the gate line SL. The first conductive pattern CP1 may overlap the underlying first storage line CSTL1, and may not overlap the gate line SL.

Further, a second conductive pattern CP2 may be formed to be spaced apart from the first conductive pattern CP1. The second conductive pattern CP2 may be a portion extending from the third drain electrode DE3 of the third switching element T3. The second conductive pattern CP2 may extend from one end of the third drain electrode DE3 toward the adjacent gate line SL. The second conductive pattern CP2 may overlap the underlying second storage line CSTL2, and may not overlap the gate line SL.

Referring to FIGS. 15 and 16, the first via hole CFH1 and the first contact hole CNT1 overlap each other, and the first gate pattern GP1 may be disposed under the first drain electrode DE1 overlapping the first contact hole CNT1 to overlap the first drain electrode DEL Further, the second via hole CFH2 and the third contact hole CNT3 overlap each other, and the second gate pattern GP2 may be disposed under the second drain electrode DE2 overlapping the third contact hole CNT3 to overlap the second drain electrode DE2. As described above, the first and second gate patterns GP1 and GP2 may be disposed under the first and second drain electrodes DE1 and DE2 to overlap the first and second drain electrodes DE1 and DE2, respectively, thereby blocking light incident from the bottom.

The first conductive pattern CP1 may be disposed on the gate insulating layer GI. More particularly, the first conductive pattern CP1 may at least partially overlap the first storage line CSTL1 and may not overlap the gate line SL. The first conductive pattern CP1 may be disposed to overlap the second via hole CFH2. At least a portion of the first conductive pattern CP1 may be exposed by the second contact hole CNT2, and the other part thereof may overlap the insulating layer 113. As such, the first conductive pattern CP1 may contact the first electrode pattern 193 disposed on the insulating layer 113 through the second contact hole CNT2.

The second conductive pattern CP2 may at least partially overlap the second gate pattern GP2 and may not overlap the gate line SL. The second conductive pattern CP2 may be disposed to overlap the second via hole CFH2. At least a portion of the second conductive pattern CP2 may be exposed by the third contact hole CNT3, and the other part thereof may overlap the insulating layer 113. In this manner, the second conductive pattern CP2 may contact the second sub-pixel electrode 192 disposed on the insulating layer 113 through the third contact hole CNT3.

Since the first conductive pattern CP1 and the second conductive pattern CP2 according to the illustrated exemplary embodiment may be disposed on the gate insulating layer GI adjacent to the gate line SL and not overlapping the gate line SL, even when the materials for color filters remain on the first conductive pattern CP1 and the second conductive pattern CP2, which are made of metal, the adhesion between the insulating layer 113 and the first conductive pattern CP1 and between the insulating layer 113 and the second conductive pattern CP2 may be excellent. In this manner, the insulating layer 113 may be prevented from being torn. Accordingly, corrosion of the gate line SL may be prevented, and short between the gate line SL and the first electrode pattern 193 may also be prevented.

Referring to FIG. 17, the display device according to another exemplary embodiment may include a first conductive pattern CP1 spaced apart from the partial voltage reference line RL.

The first conductive pattern CP1 is disposed in the second via hole CFH2 of the color filter 112, and may be spaced apart from the partial voltage reference line RL. The first conductive pattern CP1 may be disposed in the second direction, for example, in a direction parallel to the gate line SL. The first conductive pattern CP1 may be an island pattern and may not be electrically connected to other adjacent electrodes. The first conductive pattern CP1 may overlap the underlying first storage line CSTL1, and may not overlap the gate line SL.

Figure 18:
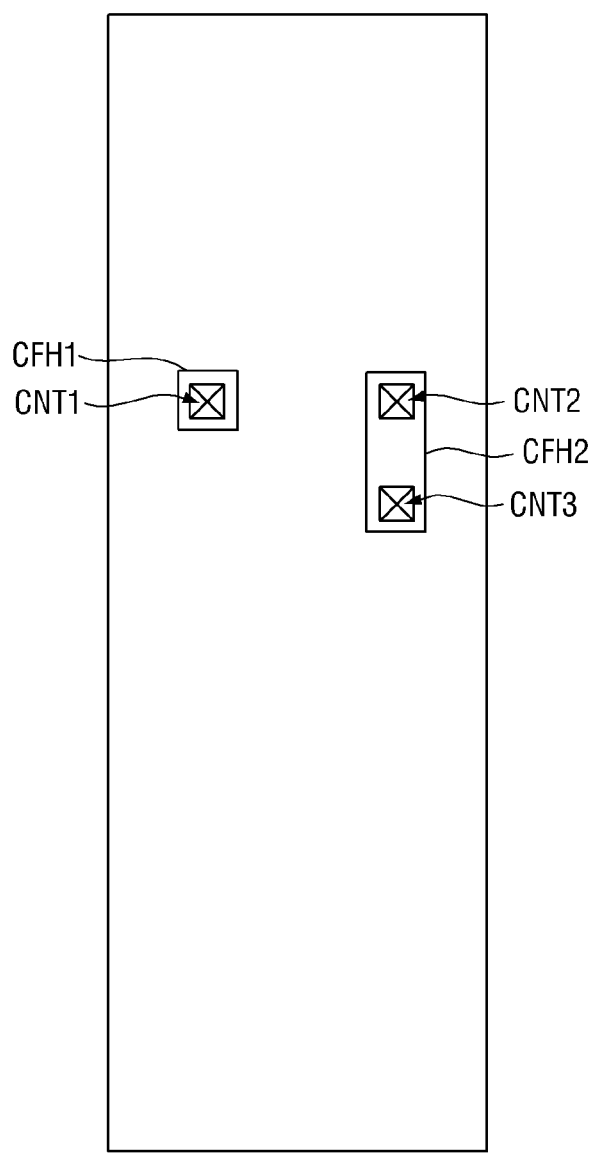
FIGS. 18 and 19 are plan views illustrating a first via hole and a second via hole arranged in a color filter of one pixel according to exemplary embodiments.
Figure 19:
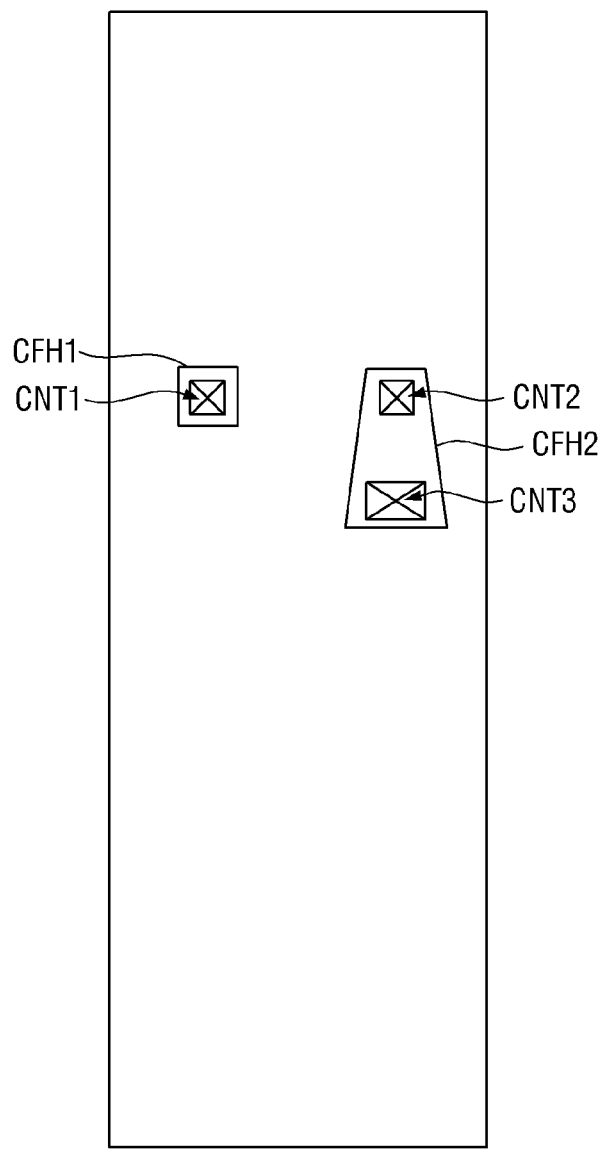

FIGS. 18 and 19 are plan views illustrating a first via hole and a second via hole arranged in a color filter of one pixel.

Referring to FIG. 18, the color filter 112 of one pixel may include a first via hole CFH1 and a second via hole CFH2. The first via hole CFH1 and the second via hole CFH2 may be spaced apart from each other.

The first via hole CFH1 may be disposed to overlap the first contact hole CNT1. The planar shape of the first via hole CFH1 may be substantially rectangular, and the planar shape of the first contact hole CNT1 overlapping the first via hole CFH1 may also be substantially rectangular. The planar shapes of the first via hole CFH1 and the first contact hole CNT1 may be substantially the same as each other, but the inventive concepts are not limited thereto. For example, the first via hole CFH1 and the first contact hole CNT1 may have other planar shapes, such as a square and a circular shape in addition to a rectangular shape, or the planar shapes thereof may be different from each other as long as they overlap each other.

The second via hole CFH2 may be disposed to overlap the second contact hole CNT2 and the third contact hole CNT3. The planar shape of the second via hole CFH2 may be substantially rectangular, and the planar shape of each of the second contact hole CNT2 and the third contact hole CNT3 overlapping the second via hole CFH2 may also be substantially rectangular. The planar shapes of the first via hole CFH1, the second contact hole CNT2, and the third contact hole CNT3 may be substantially the same as each other, but the inventive concepts are not limited thereto. For example, the first via hole CFH1, the second contact hole CNT2, and the third contact hole CNT3 may have other planar shapes, such as a square and a circular shape in addition to a rectangular shape, or the planar shapes thereof may be different from each other as long as they overlap each other.

For example, as shown in FIG. 19, the planar shape of the second via hole CFH2 may be a trapezoidal shape. Unlike the shape of the second via hole CFH2, the planar shape of each of the second contact hole CNT2 and the third contact hole CNT3 overlapping the second via hole CFH2 may be rectangular. The planar shape of the second via hole CFH2 may be different from those of the second contact hole CNT2 and the third contact hole CNT3 as long as the second via hole CFH2 overlaps the second contact hole CNT2 and the third contact hole CNT3.

In addition, as shown in FIG. 7 above, the planar shape of the second via hole CFH2 may be a polygon other than the aforementioned rectangle, trapezoid, and square. As described above, the planar shape of the second via hole CFH2 may be formed in various shapes, and any shape may be possible as long as the second via hole CFH2 overlaps the second contact hole CNT2 and the third contact hole CNT3.

In a display device constructed according to the exemplary embodiments, the aperture ratio of a pixel may be improved by forming a plurality of contact holes overlapping a via hole of a color filter.

Further, in a display device according to exemplary embodiments, corrosion of a gate line and occurrence of short may be prevented by forming a plurality of conductive patterns overlapping a via hole and an insulating layer.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device, comprising:
a gate line disposed on a substrate in a first direction;
a data line disposed in a second direction crossing the first direction;

a first thin film transistor including a first source electrode extending from the data line, and a first drain electrode spaced apart from the first source electrode;

a second thin film transistor including a second source electrode extending from the first source electrode, and a second drain electrode spaced apart from the second source electrode;

a third thin film transistor including a third drain electrode extending from the second drain electrode, and a third source electrode spaced apart from the third drain electrode;

a first sub-pixel electrode electrically connected to the first drain electrode through a first contact hole;

a first reference voltage line electrically connected to the third source electrode through a second contact hole;

a second sub-pixel electrode electrically connected to the second drain electrode through a third contact hole, a first conductive pattern extending from the third source electrode to the second contact hole, and wherein the gate line is positioned between the first contact hole and the third contact hole, wherein the first contact hole is aligned with the second contact hole in the first direction and wherein the second contact hole is at least partially aligned with the third contact hole in the second direction.

2. The display device of claim 1, wherein the first conductive pattern is disposed in parallel to the third source electrode, and wherein the first conductive pattern includes a first vertical portion extending from one end of the third source electrode in a direction crossing the third source electrode, and a first horizontal portion extending from one end of the first vertical portion in parallel to the third source electrode.

3. The display device of claim 1, wherein the first conductive pattern is spaced apart from the third source electrode.

4. The display device of claim 1, further comprising a second conductive pattern extending from the third drain electrode in a direction adjacent to the first conductive pattern.

5. The display device of claim 4, wherein the first conductive pattern and the second conductive pattern are spaced apart from each other with the gate line therebetween.

6. The display device of claim 1, wherein the first source electrode is curved.

7. The display device of claim 6, wherein the second drain electrode is extended to the third drain electrode in a straight line.

8. The display device of claim 7, further comprising a second reference voltage line crossing the gate line.

9. The display device of claim 8, wherein the second reference voltage line is electrically connected to the third source electrode.

10. The display device of claim 1, wherein the second reference voltage line is extended from the first conductive pattern.

11. The display device of claim 1, wherein the first conductive pattern is disposed in parallel to the third source electrode, and wherein the first conductive pattern includes a first vertical portion extending from one end of the third source electrode in a direction crossing the third source electrode, and a first horizontal portion extending from one end of the first vertical portion in parallel to the third source electrode.

12. The display device of claim 9, further comprising:

a second data line disposed in the second direction;

a fourth thin film transistor including a fourth source electrode extending from the second data line, and a fourth drain electrode spaced apart from the fourth source electrode;

a fifth thin film transistor including a fifth source electrode extending from the fourth source electrode, and a fifth drain electrode spaced apart from the fifth source electrode;

a sixth thin film transistor including a sixth drain electrode extending from the fifth drain electrode, and a sixth source electrode spaced apart from the sixth drain electrode;

a third sub-pixel electrode electrically connected to the fourth drain electrode through a fourth contact hole; and a fourth sub-pixel electrode electrically connected to the second drain electrode through a fifth contact hole, wherein the gate line is positioned between the first contact hole and the third contact hole, and wherein the first reference voltage line electrically connected to the sixth source electrode through a sixth contact hole.

13. The display device of claim 12, wherein a width of the first sub-pixel electrode in the second direction is wider than a width of the second sub-pixel electrode in the second direction.

14. The display device of claim 1, wherein a size of the first sub-pixel electrode is bigger than a size of the second sub-pixel electrode.

* * * * *